(12) United States Patent
Kikumoto

(10) Patent No.: US 8,134,065 B2
(45) Date of Patent: Mar. 13, 2012

(54) KEY SPEED SENSOR OF ELECTRONIC INSTRUMENT

(75) Inventor: Tadao Kikumoto, Hamamatsu (JP)

(73) Assignee: Roland Corporation, Hamamatsu (JP)

( * ) Notice: Subject to any disclaimer, the term of this patent is extended or adjusted under 35 U.S.C. 154(b) by 0 days.

(21) Appl. No.: 12/957,055

(22) Filed: Nov. 30, 2010

(65) Prior Publication Data

US 2011/0132182 A1 Jun. 9, 2011

(30) Foreign Application Priority Data

Dec. 9, 2009 (JP) ................................. 2009-279596

(51) Int. Cl.
 *G10H 1/32* (2006.01)
 *G10H 3/00* (2006.01)
(52) U.S. Cl. .......................................... 84/744; 84/733
(58) Field of Classification Search ................... 84/733, 84/744
 See application file for complete search history.

(56) References Cited

U.S. PATENT DOCUMENTS

| 4,420,754 A | 12/1983 | Andermo |
| 4,743,902 A | 5/1988 | Andermo |
| 4,878,013 A | 10/1989 | Andermo |

FOREIGN PATENT DOCUMENTS

| JP | 39-029485 B | 12/1964 |
| JP | 64-011883 B | 2/1989 |
| JP | 04-067882 B | 10/1992 |
| JP | 04-067883 B | 10/1992 |
| JP | 07-084576 A | 3/1995 |
| JP | 09-204846 A | 8/1997 |
| JP | 10-026983 A | 1/1998 |

*Primary Examiner* — Jeffrey Donels
(74) *Attorney, Agent, or Firm* — Foley & Lardner LLP

(57) ABSTRACT

A device for accurately detecting key operation speed with a simple configuration in which a plurality of alternating signals, which have mutually differing phases, is supplied to transmission electrodes. From this, capacitance between reception electrodes and the transmission electrodes is changed by a key pressing operation, and the phases of the alternating signals induced in the reception electrodes are compared and discriminated.

24 Claims, 14 Drawing Sheets

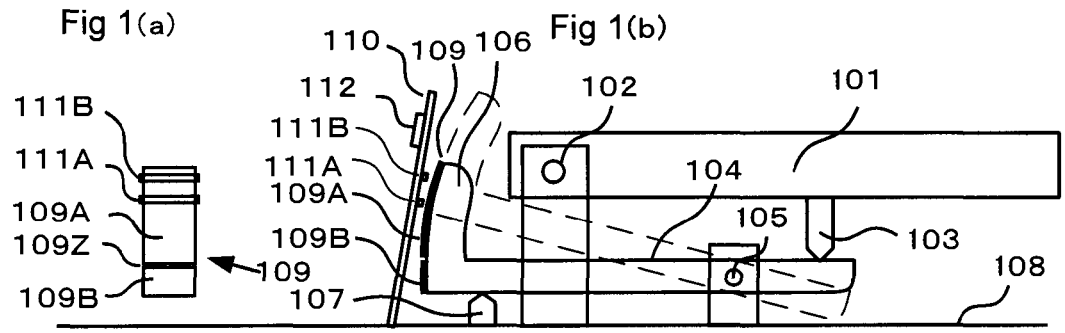
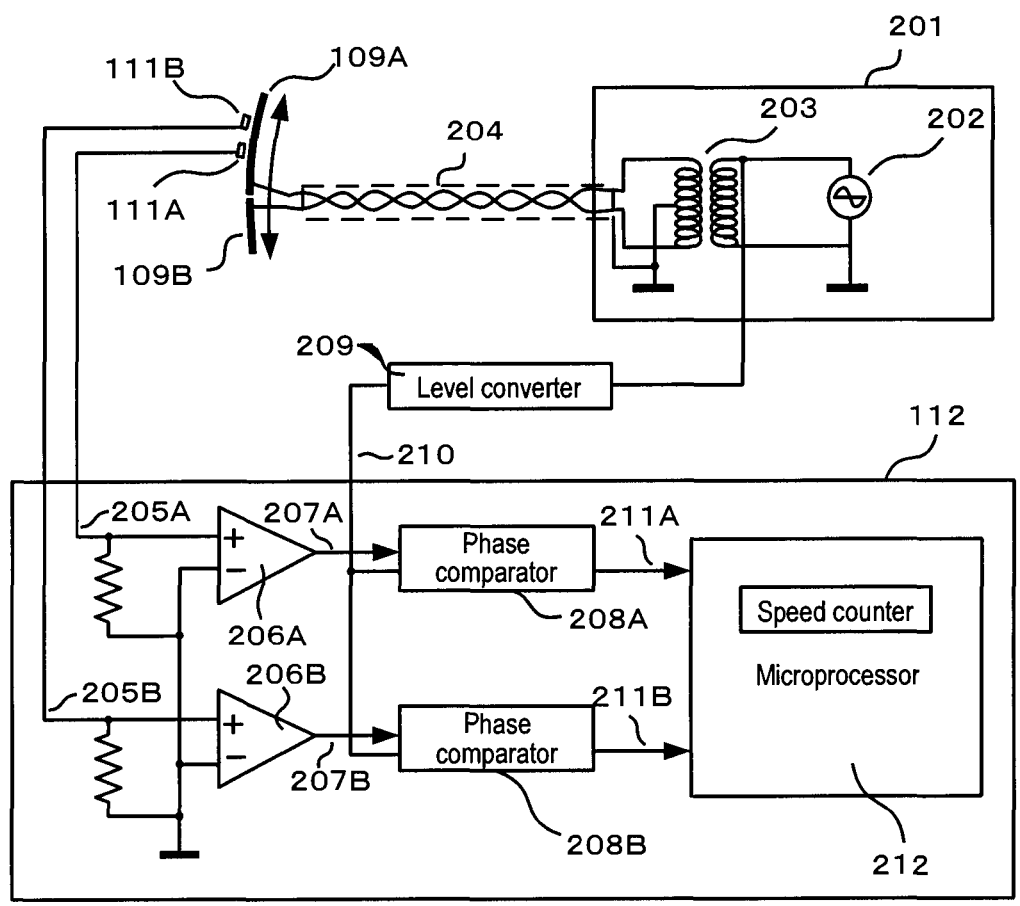
Fig. 2

Fig. 9
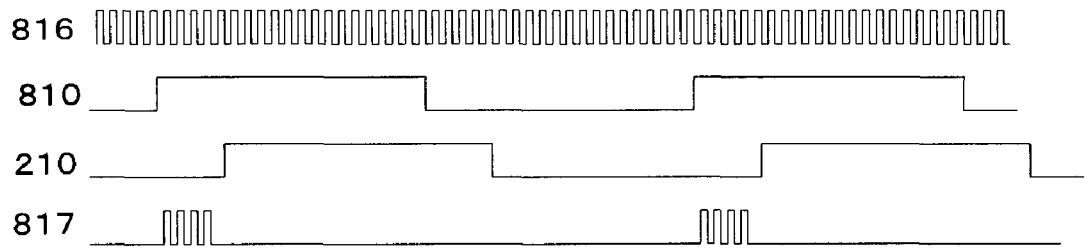
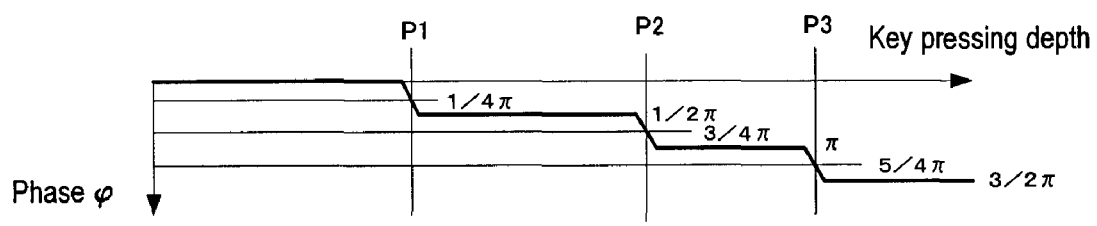
Fig. 10

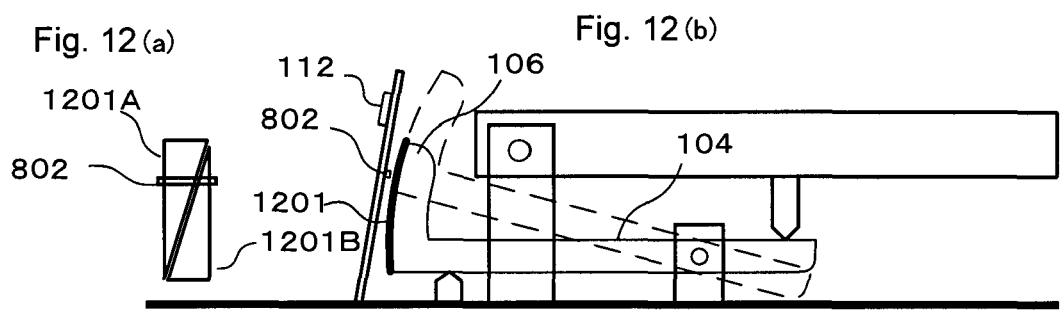

Fig. 16
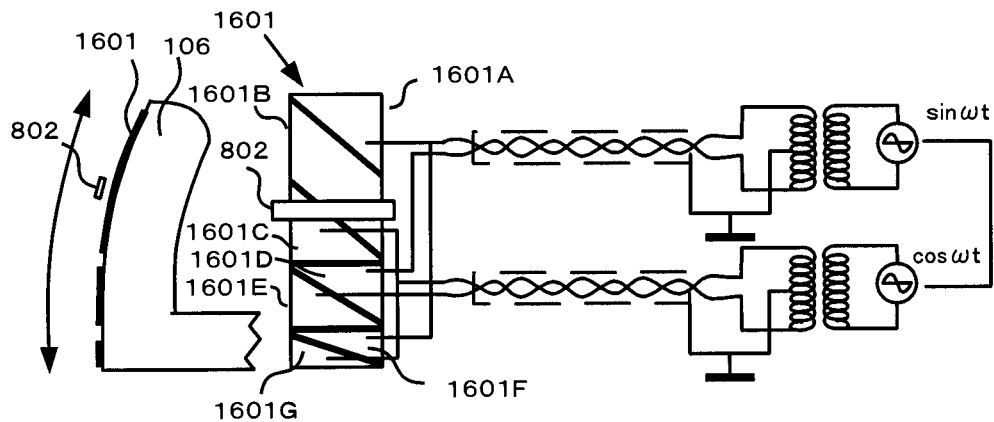
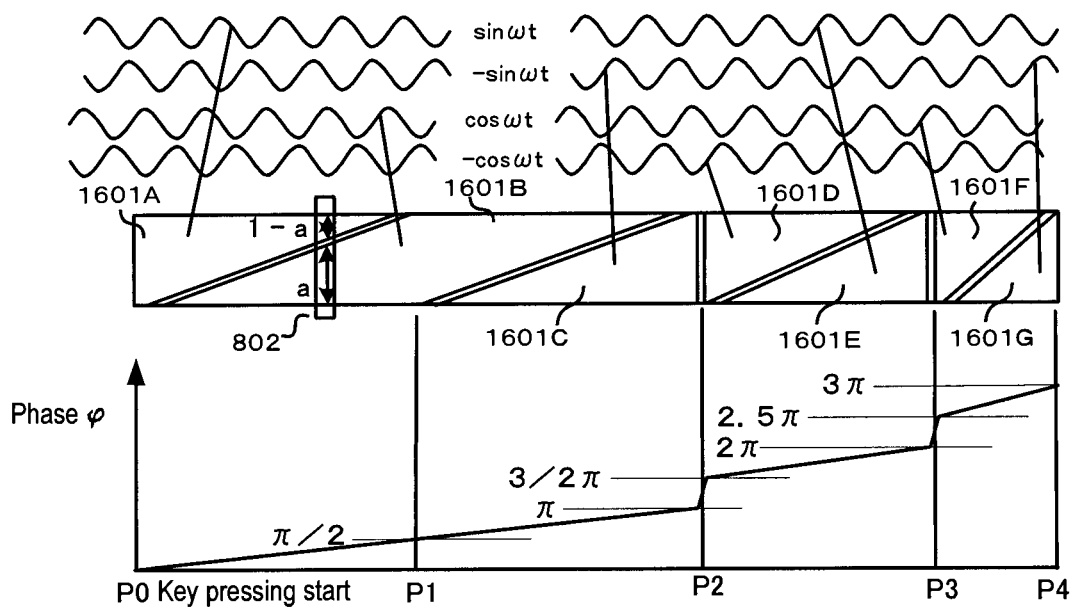
Fig. 17

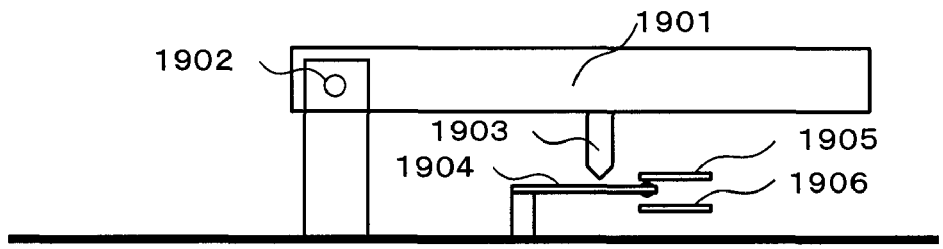
Fig. 19 (Prior Art)
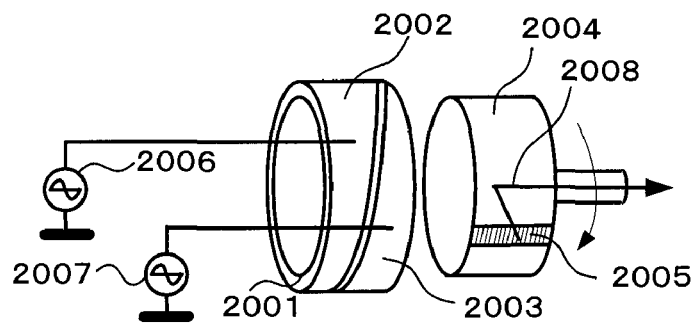
Fig. 20 (a) (Prior Art)
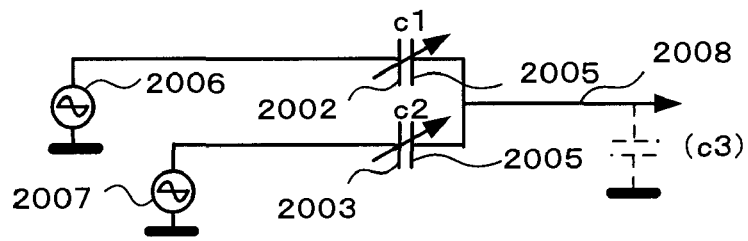
Fig. 20 (b) (Prior Art)
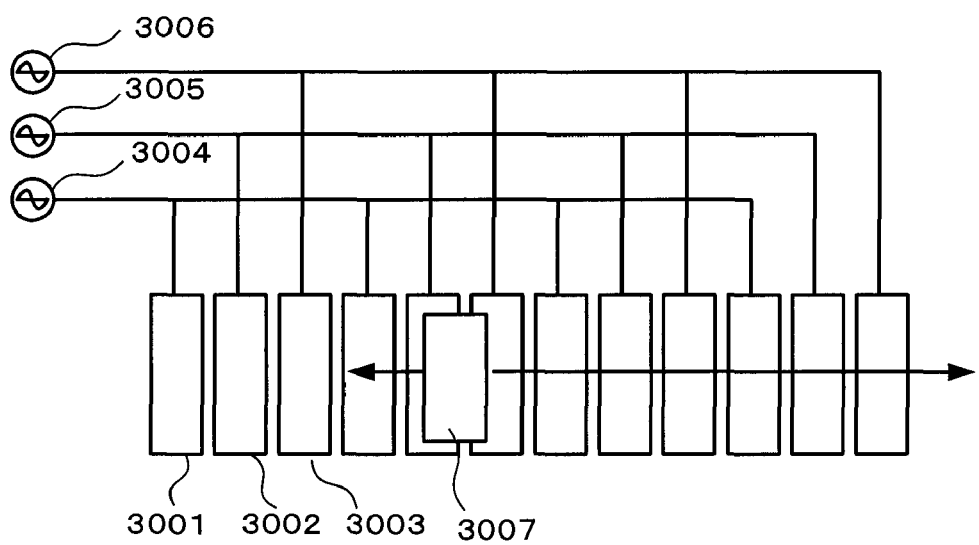
Fig. 21 (Prior Art)

KEY SPEED SENSOR OF ELECTRONIC INSTRUMENT

CROSS-REFERENCE TO RELATED PATENT APPLICATIONS

Japan Priority Application 2009-279596, filed Dec. 9, 2009 including the specification, drawings, claims, and abstract, is incorporated herein by reference in its entirety.

BACKGROUND

1. Field of the Invention

Embodiments of the present invention generally relate to key speed detection systems and methods, and, in specific embodiments, to key speed detection systems and methods for an electronic musical instrument that detects an operating speed of an operation, such as pressing, releasing, and the like, of a key.

2. Related Art

In typical key operation speed detection devices for an electronic musical instrument, the operating speed of the keys is detected by the measurement of the time difference in which two or more switches, which have been disposed corresponding to each key, open and close. In the key operation speed detection device for an electronic musical instrument shown in FIG. 19, when the performer presses the key 1901 down, the key 1901 moves rotationally about the axis of rotation 1902. Then, the jack 1903 presses the common contact 1904 of the key switch down. The common contact 1904 is in contact with the contact 1905 during the time that the key is not pressed and then is separated from the contact 1905 and meets the contact 1906 due to the pressing of the key. The operating speed of the key is detected by the time from when the common contact 1904 is separated from the contact 1905 until the common contact meets the contact 1906. This method is widely used because the structure is simple. However, the key switch produces chatter. In addition, due to the wear and deformation of the key switch after a long period of use, the operating speed cannot be measured accurately.

In addition, other methods detect key speed based on changes in the strength of light or magnetism corresponding to the operation of the key and measuring these changes by means of various kinds of sensors. Japanese Laid-Open Patent Application Publication (Kokai) Number H10-26983 discloses a device having a slit disposed that changes the amount of light transmitted between a light emitting element and a light receptor element continuously in conformance with the change in the operating position of the key. Then, the operating position of the key is detected based on the light that is sensed by the light receptor element. With this device, two light intensity thresholds are set that correspond to two operating positions of the key. In addition, the time when the light intensity that is sensed by the light receptor element passes through these thresholds is measured.

A method that detects the strength of light or a magnetic field can also be used. However, optical and magnetic sensors are expensive and it is not possible to employ them in mainstream products. In addition, with optical and magnetic sensors, there is variation in the sensitivity between individual sensors and changes in the sensitivity due to changes in temperature and the like. Accordingly, operating positions and operating speeds are derived that differ from what was intended by the designer. In other words, the accurate operating speeds are not always measured as intended.

In Japanese Examined Patent Application Publication (Kokoku) Number S39-29485, the capacitance of a capacitor is changed in conformance with the operation of the key. Then, a signal that has passed through the capacitor is reshaped via a rectifier circuit and a differentiation circuit and the key operation speed is derived. This device requires a rectifier circuit, a differentiation circuit, and the like leading to a complicated configuration.

In Japanese Laid-Open Patent Application Publication (Kokai) Number H7-84576, a capacitance sensor that has been held by a retractable wire is acted on by the key operation. Then, the oscillation frequency of an oscillator is changed by the change in the capacitance. In addition, the oscillation frequency is converted into a voltage and the depth of the key pressing is detected by the detection of the voltage. This device requires a variable oscillator, a frequency to voltage converter, and the like leading to a complicated configuration.

In Japanese Laid-Open Patent Application Publication (Kokai) Number H9-204846, a capacitive analog switch that has been furnished with a coil spring is acted on by the key operation. Then, a signal that has passed through the capacitive analog switch is A/D converted after being amplified by an amplifier. Then, in addition, the key operation speed is derived from the change in the level of the signal that has been A/D converted. This device requires an amplifier, an A/D converter, and the like leading to a complicated configuration.

For other methods used in vernier calipers, rotary encoders, and the like to measure minute positions or rotation angles, two or more alternating voltages the phases of which are mutually different are each respectively applied to a plurality of electric field generating electrodes (transmission electrodes). Then, the capacitance between the electric field generating electrodes (the transmission electrodes) and the electric field detecting electrodes (the reception electrodes) is changed in conformance with the position or the angle of the object. Then the position or the angle of the object is derived by the detection of the change in the phase of the alternating voltage that is induced in the electric field detecting electrodes (the reception electrodes). This method is referred to hereinafter as a "capacitance-phase conversion method" (e.g., Japanese Examined Patent Application Publication (Kokoku) Number H4-67883, Japanese Examined Patent Application Publication (Kokoku) Number S64-11883, and Japanese Examined Patent Application Publication (Kokoku) Number H4-67882). Incidentally, in the explanations hereinafter, the electrode that generates an electric field is referred to as a "transmission electrode" and the electrode that detects an electric field is referred to as a "reception electrode."

For example, in Japanese Examined Patent Application Publication (Kokoku) Number H4-67883, shown in FIG. 20(a), the transmission electrode 2002, the transmission electrode 2003 and the reception electrode 2005 are deployed. The transmission electrode 2002 is arranged so that the width gradually increases with respect to the circumferential direction on the outer peripheral surface of the cylinder 2001, which is configured with a dielectric. The transmission electrode 2003 is arranged so that, conversely, the width gradually decreases. The reception electrode 2005 is arranged in a concave section that has been formed in the outer peripheral surface of the rotor 2004 that rotates on the inside of the cylinder 2001. The alternating voltage 2006 and the alternating voltage 2007, the phases of which are mutually different, are applied to the transmission electrode 2002 and the transmission electrode 2003. Accordingly, the voltage that has been induced in the reception electrode 2005 is retrieved to the outside by the retrieval line 2008. A voltage in conformance with the capacitance that is formed between the transmission electrode 2002 and the reception electrode 2005 and the capacitance that is formed between the transmission electrode 2003 and the reception electrode 2005 is induced in the reception electrode 2005. The equivalent circuit for the configuration of FIG. 20(a) is shown in FIG. 20(b).

The potentials of the alternating voltage 2006 and the alternating voltage 2007 are made e1 and e2, respectively. In addition, the capacitance that is formed between the transmission electrode 2002 and the reception electrode 2005 and the capacitance that is formed between the transmission electrode 2003 and the reception electrode 2005 are made c1 and c2, respectively. The voltage V that is induced and synthesized in the reception electrode 2005 in that case becomes:

$$V=(e1*c1+e2*c2)/(c1+c2)$$ [Equation 1]

In those cases where the phase difference of the alternating voltage 2006 and the alternating voltage 2007 has been made $\pi$ (180 degrees), the voltage of the signal that is induced in the reception electrode 2005 changes in conformance with the capacitance c1 and the capacitance c2. In addition, in those cases where the phase difference of the alternating voltage 2006 and the alternating voltage 2007 has been made $\pi/2$ (90 degrees), the phase of the signal that is induced in the reception electrode 2005 changes in conformance with the capacitance c1 and the capacitance c2. As such, it is possible to derive the angle of rotation of the rotor from the change in the voltage or the phase.

In addition, in Japanese Examined Patent Application Publication (Kokoku) Number S64-1188, as shown in FIG. 21, the alternating voltages 3004, 3005, and 3006, the three respective phases of which differ mutually by $2\pi/3$ (120 degrees), are alternately applied to the rectangular transmission electrodes 3001, 3002, and 3003, which have been lined up at a uniform interval. Then, the phase of the voltage that has been induced and synthesized in the reception electrode 3007, which moves facing the transmission electrodes, is measured continuously and the measurement precision of the precision vernier caliper structure is increased.

In those cases where the voltage is detected using alternating voltages that have inverse phases, (i.e., a phase difference of it) the measurement precision of the voltage (such as the sensitivity of the amplifier that amplifies the induced voltage and the like) becomes problematic. In addition, in those cases where the voltage is measured digitally, the precision of the A/D converter also becomes problematic. Furthermore, this configuration is complicated due to the use of an A/D converter. In those cases where the phase is detected using alternating voltages having phase differences such as $\pi/2$ or $2\pi/3$ (because no A/D conversion is required), the sensitivity of the amplifier and the like does not become a problem. Thus, one can carry out high precision measurements with a simple configuration.

For a capacitance-phase conversion method used in a vernier caliper or a rotary encoder, there is no more than one phase or angle of the object that is the target of the measurement. However, in the case of an electronic musical instrument, a large number of keys (e.g., 88 keys or the like) are furnished for which detection of the operating speed of the key for each of the keys is done independently. If the circuits that generate the alternating voltages and the circuits that detect the voltage or the phase are furnished for each of this large number of keys, the configuration would become complicated and the cost would become high.

In addition, in the equivalent circuit of FIG. 20(b) that has been used in order to explain the principles of the capacitance-phase conversion method, only the capacitances c1 and c2 have been shown between the electrodes. However, as is shown by the broken line in FIG. 20(b), a capacitance c3 of about 10 pF exists that is composed of the stray capacitance of the wiring from the reception electrode to the phase measuring circuit, the input capacitance of the phase measuring circuit, and the like. Because of this, the voltage that is input to the phase measuring circuit is divided by the interelectrode capacitances c1 and c2 and the capacitance c3. In order for the voltage that is input to the phase measuring circuit to be made a satisfactory level, it is necessary to make the interelectrode capacitance large. To obtain a large capacitance, the electrode area may be made large, the interelectrode gap made small, a space not disposed in the interelectrode gap, or a material having a high dielectric constant interposed. In the device of Japanese Examined Patent Application Publication (Kokoku) Number H4-67883, because the inner circumferential surface of the cylinder 2002 and the outer circumferential surface of the rotor 2004 are placed in contact while making a cylinder 2002 with a dielectric, it is possible to obtain a large interelectrode capacitance.

In the case of a vernier caliper, or a rotary encoder and the like, even taking a configuration in which a dielectric body is interposed between the electrodes and moving the electrodes while the electrodes and the dielectric body are placed in contact would not become a great defect. In those cases where the capacitance-phase conversion method is employed in the key operation speed detection device for an electronic musical instrument, the transmission electrode (or the reception electrode) is moved in accordance with the key operation and the reception electrode (or the transmission electrode) is arranged in a position that faces the transmission electrode (or the reception electrode). However, if the configuration is such that the electrodes are moved while the electrodes and the dielectric body are placed in strong contact, there is a possibility that the operational feeling of the keys would be affected by the friction resistance.

SUMMARY OF THE DISCLOSURE

A key operation speed detection device for an electronic musical instrument having a plurality of keys may include, but is not limited to, one or more reception electrodes, two or more transmission electrodes, a keyboard device, a signal generation circuit, and a signal processing circuit. Each of the one or more reception electrodes may correspond to a key of the plurality of keys. The two or more transmission electrodes may face each of the one or more reception electrodes. The keyboard device may be configured to move one of the one or more reception electrodes and the two or more transmission electrodes relative to the other of the one or more reception electrodes and two or more transmission electrodes to change a capacitance between the one or more reception electrodes and the two or more transmission electrodes.

The signal generation circuit may be associated with at least some of the plurality of keys. The signal generation circuit may be configured to generate a plurality of alternating signals. Each of the alternating signals may have the same period and a different phase from each other. The signal generation circuit may be configured to supply each of the alternating signals to a respective one of the transmission electrodes to induce a respective detection signal. The signal generation circuit may be configured to generate a standard phase signal having the same period as the alternating signals.

The signal processing circuit may be associated with at least some of the plurality of keys. The signal processing circuit may be configured to determine a pressing depth of the key based on the standard phase signal and the detection signals. The signal processing circuit may be configured to determine an operating speed of the key based on a time interval in which the key passes at least two pressing depths.

The alternating signals generated by the signal generation circuit are used in common by a plurality of keys. The operating speed and depth of the plurality of keys are derived with a single signal processing circuit. Because of this, it is possible to accurately detect the key operating speed with a simple configuration.

In various embodiments, a gap may be arranged between the one or more reception electrodes and the two or more transmission electrodes. Because of this, the operational feeling of the keys is not affected.

In some embodiments, the alternating signals may have a voltage having a greater magnitude than the standard phase signal. Due to the fact that a strong electric field is generated by the transmission electrode, it is possible for the voltage of the alternating signal that is induced in the reception electrode to be made a level at which signal processing can be carried out by the signal processing circuit while disposing a space between the transmission electrode and the reception electrode. Because of this, it is possible to detect the key operating speed and depth stably and without contact.

In further embodiments, at least one of the two or more transmission electrodes and the one or more reception electrodes may be covered by an insulating layer. In those cases where an insulating film is placed on the transmission electrode, a leakage current or discharge between the electrodes is inhibited in environments of high humidity or high dust even if a strong electric field is generated by the transmission electrode. On the other hand, in those cases where the insulating film is placed on the reception electrode, the leakage of the signal that has been induced in the reception electrode is inhibited. Accordingly, the stable detection of the key operation speed is possible.

In further embodiments, the device may include wiring for supplying the plurality of alternating signals as a pair to the two or more transmission electrodes. The wires may comprise one of parallel wires, twisted pair wires, and shielded wiring. The phases of the alternating signals may differ by $\pi$.

Even if a strong electric field is generated by the transmission electrode, undesired radiation from the long wiring from the signal generation circuit to the transmission electrode is cancelled out. Because of this, it is possible to have the signal generation circuit in common for a plurality of keys and provide an inexpensive device.

In further embodiments, the device may include wiring for supplying the plurality of alternating signals as a pair to the two or more transmission electrodes. The wires may comprise one of parallel wires, twisted pair wires, and shielded wiring. The phases of the plurality of alternating signals may have a phase such that the plurality of alternating signals is cancelled out.

Even if a strong electric field is generated by the transmission electrode, undesired radiation from the long wiring from the signal generation circuit to the transmission electrode is cancelled out. Because of this, it is possible to have the signal generation circuit in common for a plurality of keys and provide an inexpensive device.

In various embodiments, the one or more reception electrodes may comprise a plurality of reception electrodes corresponding to each key of the plurality of keys. The two or more transmission electrodes may comprise two transmission electrodes. The signal generating circuit may be configured to supply two alternating signals respectively to the two transmission electrodes. The phases of the two alternating signals may mutually differ by $\pi$. The signal processing circuit may be configured to determine the operating speed of the key based on the time interval for the phase inversion by the alternating signals from at least two reception electrodes of the plurality of reception electrodes for each key of the plurality of keys.

It is possible to discriminate the phases of alternating signals from the reception electrode and detect that the reception electrode is positioned in the middle of the two transmission electrodes with a simple configuration. Because of this, it is possible to derive the operation speed of the key based on the time interval of the phase inversion of the alternating signals from at least two reception electrodes.

In various embodiments, the one or more reception electrodes may comprise one reception electrode corresponding to each key of the plurality of keys. The two or more transmission electrodes may comprise two transmission electrodes. The signal processing circuit may be configured to determine the operating speed of the key based on the time interval when the phase of the alternating signal from the reception electrode of each key becomes identical to at least two specified phases.

As such, it is possible to discriminate the phases of alternating signals from the reception electrode with a simple configuration. Because of this, it is possible to derive the operation speed of the key based on the time interval in which there is a specified change by the phase of the alternating signal. In addition, by discriminating the phase of the alternating signal, not only is it possible to derive the operation speed of the key, but also to derive the depth of the key operation at the same time.

In various embodiments, the two or more transmission electrodes may be arranged on the key or a member connected to the key. The one or more reception electrodes and the signal processing circuit may be arranged on a base of the keyboard device.

Because the reception electrode and the signal processing circuit are disposed on the same member, it is possible to make the wiring from the reception electrode to the signal processing circuit short. Because of this, it is possible to effectively conduct the alternating signal that has been induced in the reception electrode to the signal processing circuit.

In various embodiments, the one or more reception electrodes may be arranged on the key or a member connected to the key. The one or more transmission electrodes and the signal generation circuit may be arranged on a base of the keyboard device.

The distance from the signal generation circuit to the transmission electrode can be made short; and the small reception electrode can be moved by a large amplitude. Because of this, it is possible to make the keyboard device small.

In some embodiments, the device may include wiring for supplying the alternating signals to the signal processing circuit, the wiring having shielding that is sandwiched by a ground line. Thus, it is possible to prevent interfering waves from being introduced into the wires.

A detection device for detecting a key operation of an electronic musical instrument having a plurality of keys may include, but is not limited to, one or more reception electrodes, two or more transmission electrodes, a key element, a signal generation circuit, and a signal processing circuit. Each of the one or more reception electrodes may correspond to a key of the plurality of keys. The two or more transmission electrodes may face each of the one or more reception electrodes. The key element may be configured to move one of the one or more reception electrodes and the two or more transmission electrodes relative to the other of the one or more reception electrodes and two or more transmission electrodes to change a capacitance between the one or more reception electrodes and the two or more transmission electrodes.

The signal generation circuit may be associated with at least some of the plurality of keys. The signal generation circuit may be configured to generate a plurality of alternating signals. Each of the alternating signals may have the same period and a different phase from each other. The signal generation circuit may be configured to supply each of the alternating signals to a respective one of the transmission electrodes to induce a respective detection signal. The signal generation circuit may be configured to generate a standard phase signal having the same period as the alternating signals. The signal processing circuit may be associated with at least some of the plurality of keys. The signal processing circuit may be configured to determine a pressing depth of the key based on the standard phase signal and the detection signals.

In various embodiments, the signal processing circuit may be configured to determine an operating speed of the key based on a time interval in which the key moves from a first pressing depth to a second pressing depth. In some embodiments, the one or more reception electrodes may comprise two reception electrodes corresponding to the key. The two reception electrodes may comprise a first reception electrode and a second reception electrode. The first pressing depth may correspond to a change in the detected signal of the first reception electrode. The second pressing depth may correspond to a change in the detected signal of the second reception electrode.

In various embodiments, a gap may be arranged between the one or more reception electrodes and the two or more transmission electrodes. In various embodiments, the alternating signals may have a voltage having a greater magnitude than the standard phase signal. In various embodiments, at least one of the two or more transmission electrodes and the reception electrodes may be covered by an insulating layer.

In various embodiments, the phases of the alternating signals may differ by $\pi$. In various embodiments, the phases of the plurality of alternating signals may have a phase such that the plurality of alternating signals is cancelled out.

In various embodiments, the one or more reception electrodes may comprise a plurality of reception electrodes corresponding to each key of the plurality of keys. The two or more transmission electrodes may comprise two transmission electrodes. The signal generating circuit may be configured to supply two alternating signals, the phases of which mutually differ by $\pi$, respectively to the two transmission electrodes. The signal processing circuit may be configured to determine the operating speed of the key from the time interval for the phase inversion by the alternating signals from at least two reception electrodes of the plurality of reception electrodes for each key of the plurality of keys.

In various embodiments, the one or more reception electrodes may comprise one reception electrode corresponding to each key of the plurality of keys. The two or more transmission electrodes may comprise two transmission electrodes. The signal processing circuit may be configured to determine the operating speed of the key from the time interval when the phase of the alternating signal from the reception electrode of each key becomes identical to at least two specified phases.

In some embodiments, when the key is operated between the at least two specified ranges, the two transmission electrodes may be arranged to face the one reception electrode and may be arranged so that a rate of each of the two transmission electrodes changes as an operating position of the key changes. In further embodiments, at least one of the at least two specified phases is set by a user.

In various embodiments, the two or more transmission electrodes may be arranged on one of the key or a member connected to the key and a base of the key element. The one or more reception electrodes may be arranged on the other of the key or the member connected to the key and the base of the key element.

BRIEF DESCRIPTION OF THE DRAWINGS

FIG. 1(a) is a drawing of an electrode according to an embodiment of the present invention;

FIG. 1(b) is a side-view drawing of a key, a hammer, a transmission electrode, and a reception electrode according to an embodiment of the present invention;

FIG. 2 is a drawing of a signal generation circuit and a logic integrated circuit according to an embodiment of the present invention;

FIG. 9 is a drawing showing the relationship of a master clock, a phase pulse, a standard phase signal, and a gate output according to an embodiment of the present invention;

FIG. 10 is a drawing showing a state of a phase when key pressing depth has changed according to an embodiment of the present invention;

FIG. 12(a) is a drawing of electrodes according to an embodiment of the present invention viewed from a front side of a tip section of a hammer;

FIG. 12(b) is a side-view drawing showing a basic structure of a transmission electrode according to an embodiment of the present invention;

FIG. 16 is a drawing showing a transmission electrode, a reception electrode, and a signal generation circuit according to an embodiment of the present invention;

FIG. 17 is a drawing showing a state of a phase when a signal is applied to a transmission electrode and key pressing depth has changed according to an embodiment of the present invention;

FIG. 19 is a drawing showing a prior art key operation speed detection device for an electronic musical instrument;

FIG. 20(a) is a drawing showing prior art technology that detects angle of rotation of an object;

FIG. 20(b) is a drawing showing the equivalent circuit of FIG. 20(a); and

FIG. 21 is a drawing showing prior art technology that detects the position of an object.

DETAILED DESCRIPTION

Figure 3:
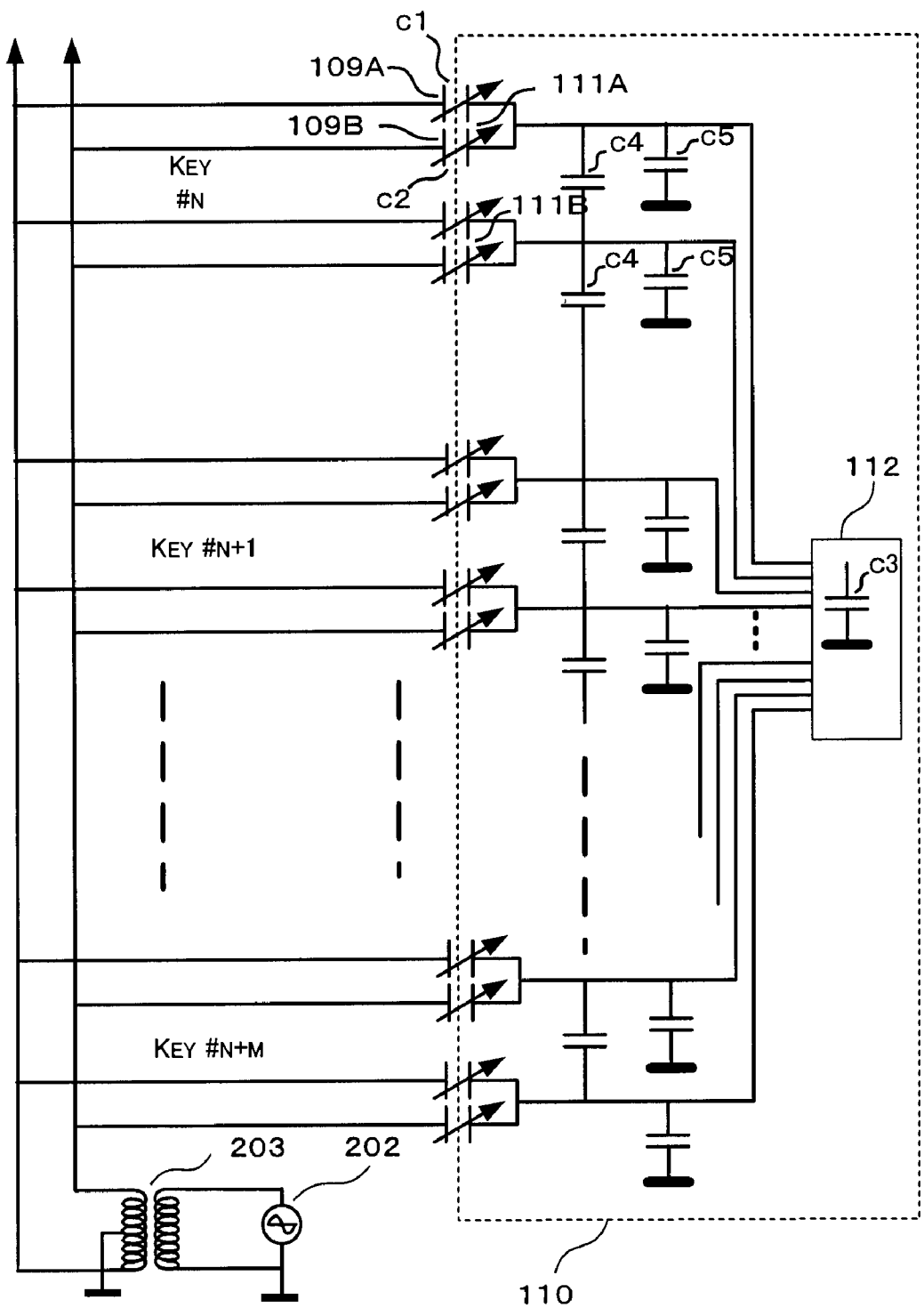
FIG. 3 is a drawing showing an equivalent circuit of a transmission electrode, a reception electrode, and a logic integrated circuit according to an embodiment of the present invention.

FIGS. 1(a) and 1(b) illustrate portions of a key operation speed detection device for an electronic musical instrument according to an embodiment of the present invention. In general, a key 101 (from among a plurality of keys) is described; the other keys are configured similarly.

When a performer presses the key 101 down, the key 101 moves rotationally about the axis of rotation 102. A jack 103 linked to the key 101 moves a hammer 104. The hammer 104 moves rotationally about an axis of rotation 105 and a tip section 106 of the hammer 104 rises upward. By releasing the key 101, the key 101 is returned to the original position by a bias member (not shown), such as a spring or the like. The hammer 104 returns to the original position by its own weight. In doing so, the hammer contacts a receiving member 107. These key mechanisms are constructed on a keyboard base 108.

A transmission electrode 109 is arranged on the tip section 106 of the hammer 104. The transmission electrode 109 is configured by a first transmission electrode 109A and a second transmission electrode 109B, both of which may be rectangular. The first transmission electrode 109A and the second transmission electrode 109B are insulated and fixed to the tip section 106. A prescribed gap 109Z is provided between the first transmission electrode 109A and the second transmission electrode 109B in the direction of movement of the hammer 104. The length of the first transmission electrode 109A (the length with regard to the direction of movement of the hammer 104) is longer than the length of the second transmission electrode 109B. In addition, the first transmission electrode 109A is arranged above the second transmission electrode 109 B. The widths of both transmission electrodes 109A, 109B (the length in the direction perpendicular to the direction of movement of the hammer 104) are made roughly the same as the width of the hammer 104. In some embodiments, an insulating film may be placed on the electrode surfaces and/or in the gap 109Z to inhibit leakage or discharge of electricity.

A speed detection circuit board 110 is disposed in a position facing the tip section 106 of the hammer 104 of the keyboard base 108. A first reception electrode 111A and a second reception electrode 111B, which are both rectangular, are printed or mounted on the speed detection circuit board 110 with a prescribed gap along the direction of movement of the hammer 104. A logic integrated circuit 112 is mounted on the speed detection circuit board 110. The reception electrode 111A and the reception electrode 111B are arranged with a prescribed gap disposed so that the reception electrodes 111A, 111B do not contact the transmission electrode 109A and the transmission electrode 109B when the hammer 104 moves rotationally. In addition, the reception electrode 111A and the reception electrode 111B are arranged to face and be adjacent to the transmission electrodes 109A, 109B.

Incidentally, the surface of the tip section 106 of the hammer 104 that faces the reception electrodes 111A, 111B is curved to correspond with the curve of rotation so that the distance between the transmission electrodes 109A, 109B and the reception electrodes 111A, 111B does not change at the time of the rotational movement by the hammer 104. A length of each of the reception electrodes 111A, 111B in the direction of movement of the hammer 104 is shorter than a length of each of the transmission electrodes 109A, 109B so that the effect of the transmission electrodes 109A, 109B is localized. A width of each of the reception electrodes 111A, 111B in the direction that is perpendicular to the direction of movement of the hammer 104 is made roughly the same as a width of each of the transmission electrodes 109A, 109B. In addition, the reception electrode 111A is arranged above the second reception electrode 111B. In a state in which the key is not pressed, both of the reception electrodes 111A, 111B face the first transmission electrode 109A. When the key is pressed, the tip 106 of the hammer 104 moves upward. As such, the transmission electrode 109A and the transmission electrode 109B move past each of the reception electrodes 111A, 111B. In some embodiments, an insulation film may be placed on the electrode surface and/or the space provided between the reception electrodes 111A, 111B to inhibit leakage of the signal induced in the reception electrodes 111A, 111B.

FIG. 2 illustrates an internal configuration of a signal generation circuit 201 and a logic integrated circuit 112 according to an embodiment of the present invention. The signal generation circuit 201 is a circuit that generates a signal that is applied to the transmission electrode. The logic integrated circuit 112 is a circuit that processes the signal that has been induced in the reception electrode. The signal generation circuit 201 is arranged on the keyboard base 108 (FIG. 1).

The signal generation circuit 201 is configured by a sine wave oscillator 202 and a balance boost transformer 203. The sine wave oscillator 202 generates an alternating sine wave signal in the 100 kHz long wave band. The signal generated is raised to a high voltage by the balance boost transformer 203. Incidentally, one end of the output of the sine wave oscillator 202 is connected to ground. The center tap on the secondary side of the balance boost transformer 203 is connected to ground. Two high voltage alternating signals, the voltages of which are equal and the phases of which mutually differ by $\pi$ (inverse phase), are output from the terminals on the two ends of the secondary side of the balance boost transformer 203. The voltage boosting ratio of the balance boost transformer 203 will be discussed later. Only a single key has been shown here as representative, but the signal generation circuit 201 is used in common for a plurality of keys and the high voltage alternating signals from the sine wave oscillator 202 are supplied to the transmission electrodes of a plurality of keys.

Wiring 204 may be parallel wiring, twisted pair wiring, or shielded wiring. The core wiring of the shielded wiring made of parallel wires or twisted pair wires may be covered with a shield to reduce radiation from the wiring 204. If the wiring 204 is made as parallel wiring or twisted pair wiring, because the signals that pass through the wiring 204 are mutually inverse phases, they are mutually cancelled and the radiation is reduced. If the wiring is shielded, the radiation from the wiring 204 is further reduced. The radiation from the wiring 204 becomes successively smaller with parallel wiring, twisted pair wiring, and shielded wiring. In various embodiments, the structure of the wiring 204 may be determined based on the magnitude of the radiation, the cost, and the like.

Incidentally, in those cases where shielded wiring is used as the wiring 204, the shielding of the wiring 204 is connected to ground as shown in FIG. 2. In addition, the balance boost transformer 203 is furnished on the keyboard base 108 and the transmission electrode 109 is disposed on the hammer 104 (FIG. 1). Thus, in some embodiments, a wire material having high flexibility may be used so that the locations among the wiring 204 where the signal is transferred to the hammer 104 do not impede the operation of the hammer 104.

The alternating signal that has been applied to the transmission electrode 109A is induced in the reception electrode 111A and the reception electrode 111B through the capacitance that has been formed between the transmission electrode 109A and the reception electrode 111A and the reception electrode 111B. In the same manner, the alternating signal that has been applied to the transmission electrode 109B is induced in the reception electrode 111A and the reception electrode 111B through the capacitance that has been formed between the transmission electrode 109B and the reception electrode 111A and the reception electrode 111B. These capacitances change together with the movement of the hammer 104.

The alternating signals that have been induced in the reception electrode 111A and the reception electrode 111B are supplied to the logic integrated circuit 112. The wiring from the reception electrode 111A and the reception electrode 111B to the logic integrated circuit 112 is surrounded by shielding or copper foil (not shown) to inhibit crosstalk from the adjacent wiring or the introduction of noise.

In FIG. 3, an equivalent circuit for the plurality of transmission electrodes and reception electrodes and up to the logic integrated circuit 112 is shown. A capacitor c1 is the capacitance that has been formed between the transmission electrode 109A and the reception electrode 111A or 111B. A capacitor c2 is the capacitance that has been formed between the transmission electrode 109B and the reception electrode 111A or 111B. A capacitor c3 is the input capacitance of the logic integrated circuit 112. Capacitors c4 are the stray capacitance between the wiring of the adjacent reception electrodes on the speed detection circuit board 110. The capacitances c4 are the cause of crosstalk. The capacitors c5 each show the stray capacitance of the wiring from the reception electrodes 111A, 111B to the logic integrated circuit 112.

The capacitances of the capacitor c1 and the capacitor c2 depend on the size of the electrodes and the distance between the electrodes, but are less than 1 pF. The capacitance of the capacitor c3 is generally around 5 pF. In those cases where the wiring from the reception electrodes 111A, 111B to the logic integrated circuit 112 has been surrounded by shielding or copper foil, the capacitor c4 becomes smaller and c5 becomes larger.

If the alternating signals that are applied to the transmission electrode 109A and the transmission electrode 109B are made e1 and e2 respectively, the voltage that is input to the logic integrated circuit 112 becomes:

$$V=(e1*c1+e2*c2)/(c1+c2+c3+c5)$$ [Equation 2]

The capacitances of the capacitors c3 and c5 are greater than the capacitance of the capacitor c1 and the capacitor c2 by at least an order of magnitude. Therefore, the voltage that is input to the logic integrated circuit 112 becomes about 1 to 5 percent of the voltage that is applied to the transmission electrode. Because of this, the boost ratio of the balance boost transformer 203 is set to around the ratio of the capacitance of the capacitors c3 and c5 and the capacitance of the capacitor c1 and the capacitor c2. By making the voltage that is applied to the transmission electrode a high voltage in this manner, it is possible to obtain a signal having a satisfactory level for the digital processing by the logic integrated circuit 112 even if the capacitance that is formed between the transmission electrode and the reception electrode is small.

Incidentally, although not shown in FIG. 3, stray capacitance is present in the wiring from the secondary side of the balance boost transformer 203 to the transmission electrode 109A and the transmission electrode 109B. Furthermore, stray capacitance may exist between the transmission electrode 109A and the transmission electrode 109B, and ground. Accordingly, on the secondary side of the balance boost transformer 203, the stray capacitances of the number of keys that have been connected are added and become a load. If the ratio of the number of windings between the two ends on the primary side and the secondary side of the balance boost transformer 203 is made n, the value of the stray capacitance viewed from the primary side of the balance boost transformer 203 is $n^2$ times the stray capacitance of the secondary side. A resonant circuit is formed by the stray capacitance, which has become $n^2$ times, and the inductance of the primary side of the balance boost transformer 203.

In some embodiments, the coils of the balance boost transformer 203 may be designed such that the resonant frequency of this resonant circuit matches the frequency of the alternating signal that is generated by the sine wave oscillator 202. Because the inductance viewed from the primary side of the balance boost transformer 203 becomes high, it is possible to make the current that flows on the primary side of the balance boost transformer 203 small. As such, the power efficiency for boosting the voltage is improved and the balance boost transformer 203 can be made smaller. In addition, the phase difference of the signal of the primary side and the signal of the secondary side of the balance boost transformer 203 can be minimized. As a result, the errors in the phase measurement results may be reduced. However, it should be noted that the resonant frequency of the resonant circuit and the frequency of the alternating signal that is generated by the sine wave oscillator must be accurately adjusted so that a discrepancy in the phase is not produced.

In some embodiments, the high voltage alternating signal that is applied to the electrode may be generated using an amplifier circuit in which a high voltage driver is employed instead of a boost transformer. In these cases, there is no need for the tuning of the resonant circuit.

Incidentally, because the previously mentioned capacitance c5 is the stray capacitance of the wiring from the reception electrode to the logic integrated circuit 112, the size of the capacitance is determined by the length of the wiring. In those cases where one logic integrated circuit 112 undertakes the speed detection of a large number of keys, the lengths of each respective conductor from the reception electrode 111A and the reception electrode 111B on the speed detection circuit board 110 to the logic integrated circuit 112 differs greatly depending on the key. As a result, the size of the capacitance c5 greatly differs depending on the key. In this case, relaying may be done by a buffer that has a comparatively small degree of amplification such as a low cost CMOS inverter near the reception electrode 111A and reception electrode 111B. As a result, the capacitance c5 of the conductor can be minimized and the crosstalk between conductors and the effects due to external noise may be reduced.

Returning to FIG. 2, a detection signal 205A and a detection signal 205B that have been respectively induced in the reception electrode 111A and the reception electrode 111B are supplied to the logic integrated circuit 112. The detection signal 205A and the detection signal 205B are input to the positive input terminals of a voltage comparator 206A and a voltage comparator 206B, respectively. A resistor approximately several MΩ is connected between the positive input terminals of the voltage comparator 206A and the voltage comparator 206B and ground. The negative input terminals of the voltage comparator 206A and the voltage comparator 206B are connected to ground.

In those cases where the voltage of the positive input terminal of the voltage comparator 206A and the voltage comparator 206B is higher than the voltage of the negative input terminal, a "1" is output and in those cases where the voltage of the positive input terminal is lower than the voltage of the negative input terminal, a "0" is output. Accordingly, the detection signal 205A and the detection signal 205B are each converted into their respective logic levels and respectively made a phase pulse 207A and a phase pulse 207B.

The phase pulse 207A and the phase pulse 207B are transmitted to a phase comparator 208A and a phase comparator 208B, respectively. The signal from the sine wave oscillator 202 is converted to a logic level by a level converter 209 into a standard phase signal 210, and transmitted to the phase comparator 208A and the phase comparator 208B. The phase comparator 208A takes an exclusive OR of the phase pulse 207A and the standard phase signal 210 and supplies this to microprocessor 212 as a phase output 211A. In the same manner, the phase comparator 208B takes an exclusive OR of the phase pulse 207B and the standard phase signal 210 and supplies this to the microprocessor 212 as a phase output 211B.

The microprocessor 212, when a Note On has been determined based on the phase output 211A and the phase output 211B, transmits a Note On instruction that includes the key pressing speed information to a sound source (not shown). Similarly, the microprocessor 212 transmits a Note Off instruction that includes the key release speed information when a Note Off has been determined.

In some embodiments, the logic integrated circuit 112 is arranged for the plurality of keys for each octave, and the processing is carried out for the plurality of keys by a single logic integrated circuit 112. In the logic integrated circuit 112, the component elements other than the microprocessor 212 are equipped independently for each key. However, only one microprocessor 212 is disposed and thus the processing for a plurality of keys is carried out by a single microprocessor 212. In other embodiments, only the component elements other than the microprocessor 212 are disposed in the logic integrated circuit 112 and the microprocessor 212 may be a separate component. In this case, a plurality of logic integrated circuits 112 is connected to a single microprocessor 212 and the processing for the plurality of logic integrated circuits 112 is carried out by the single microprocessor 212.

Figure 4:
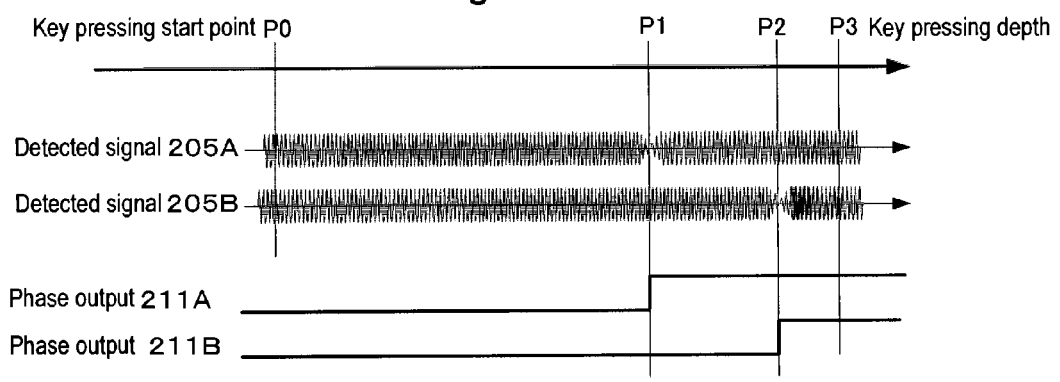
FIG. 4 is a drawing showing signal states when key pressing depth changes according to an embodiment of the present invention.
Figure 5:
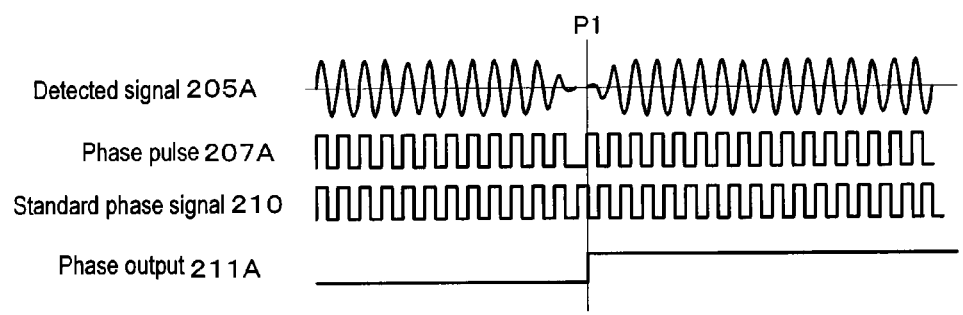
FIG. 5 is an expanded drawing of the signals shown in FIG. 4.

FIG. 4 is a graph illustrating the detection signal 205A, the detection signal 205B, the phase output 211A, and the phase output 211B when the key pressing depth has changed. In FIG. 5, the relationships of the detection signal 205A (as shown in FIG. 4), the phase pulse 207A, the standard phase signal 210, and the phase output 211A are shown expanded in the direction of the key pressing depth. With reference to FIGS. 4 and 5, for the key pressing starting point P0 (i.e., the initial position), the key pressing depth of the state in which the key has not yet been pressed is shown. For the key pressing depth P1, the depth at which the reception electrode 111A is located at the boundary of the transmission electrode 109A and the transmission electrode 109B is shown. For the key pressing depth P2, the depth at which the reception electrode 111B is located at the boundary of the transmission electrode 109A and the transmission electrode 109B is shown. For the key pressing depth P3, the position at which the key has been pressed to the deepest position is shown.

At the key pressing starting point P0, the transmission electrode 109A is facing both the reception electrode 111A and the reception electrode 111B. Because of this, the alternating signal is steadily induced in both the reception electrode 111A and the reception electrode 111B. The phase pulse 207A and the standard phase signal 210 are the same phase. Therefore, the phase output 211A of the result of the exclusive OR by the phase comparator 208A becomes "0." In the same manner, the phase output 211B also becomes "0."

When the key is pressed and the key pressing depth approaches the first key pressing depth P1, the effect of the transmission electrode 109A on the reception electrode 111A becomes smaller and, conversely, the effect of the transmission electrode 109B on the reception electrode 111A becomes greater. Because of this, the signal that is applied by the transmission electrode 109A is offset by the signal having an inverse phase that is applied by the transmission electrode 109B, and the amplitude of the signal that is induced and synthesized in the reception electrode 111A is reduced.

At the time that the key pressing depth has reached the first key pressing depth P1, the reception electrode 111A becomes positioned at the boundary of the transmission electrode 109A and the transmission electrode 109B, and the effects from the two transmission electrodes on the reception electrode 111A become equal. At this time, the signals that are induced and synthesized in the reception electrode 111A cancel each other and become "0." Because, at this moment, the level of the alternating signal 204 becomes "0," the phase becomes indefinite.

When the key pressing depth goes beyond the first key pressing depth P1, the effect of the transmission electrode 109A on the reception electrode 111A becomes smaller, and the effect of the transmission electrode 109B becomes greater. Because of this, the induced voltage rapidly increases and, moreover, the phase is distinctly inverted and the phase output 211A changes from a "0" to a "1."

When the pressed key advances further, the boundary of the transmission electrode 109A and the transmission electrode 109B goes past above the reception electrode 111B. Proceeding in the same manner as in the case discussed before, the key pressing depth passes the second key pressing depth P2, and the phase output 211B changes from "0" to "1."

The time difference of the timing in which the phase output 211A and the phase output 211B, which have been obtained in this manner, change from "0" to "1" is the time difference of the transition by the key pressing depth from the first key pressing depth P1 to the second key pressing depth P2. Therefore, this time difference is measured by the microprocessor 212 using a speed counter and it is possible to derive the key pressing speed from this. Since this time difference is approximately a few milliseconds, a standard phase signal 210 having a period of 10 microseconds can be used to count.

Figure 6:
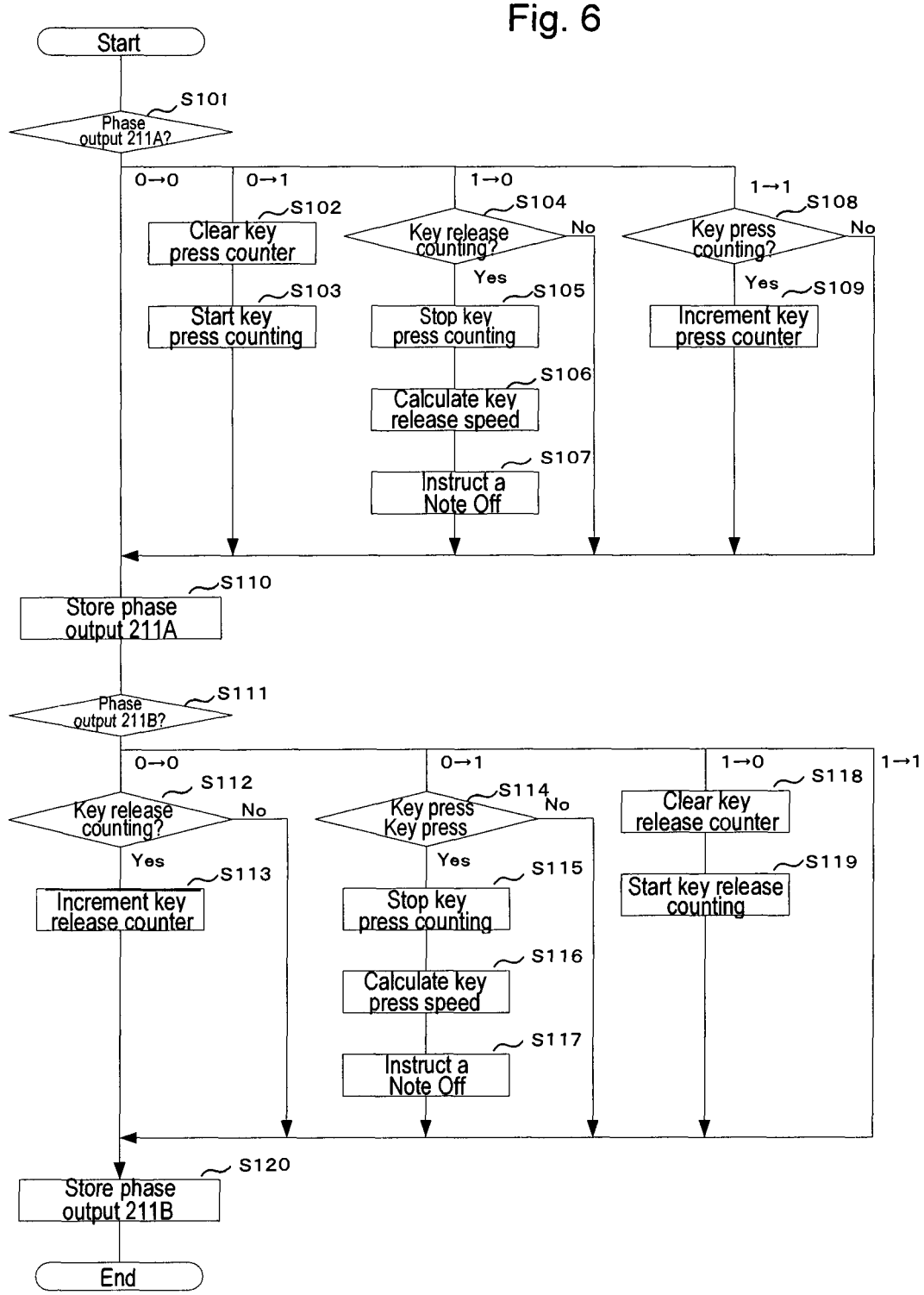
FIG. 6 is a flowchart of processing carried out by a microprocessor according to an embodiment of the present invention.

FIG. 6 illustrates a process carried out by the microprocessor 212 (FIG. 2). Although the process is carried out for a plurality of keys, for simplification, the process for only one key is discussed. This processing is launched repeatedly for each specified period. In addition, the variables that are used in the processing are initialized when the power is turned on by processing that is not shown in the drawing.

In step S101, the level change of the phase output 211A (FIG. 2) from the previous processing is determined. Incidentally, the level of the phase output 211A in the previous processing is stored in Step S110, which will be discussed later. In those cases where the current level is "0" and there has been no change from the previous processing, the routine proceeds to step S110. In those cases where the level has changed from "0" to "1," the routine proceeds to step S102. In those cases where the level has changed from "1" to "0," the routine proceeds to step S104. In those cases where the level is "1" and has not changed from the previous processing, the routine proceeds to step S108.

In step S102, the value of the key pressing counter is cleared and the routine proceeds to step S103. In step S103, the counting by the key pressing speed counter is started and the routine proceeds to step S110.

In step S104, a determination is made as to whether the key release speed counter is currently counting. In those cases where the counter is currently counting, the routine proceeds to step S105. In those cases where the counter is not currently counting, the routine proceeds to step S110. In step S105, the counting of the key release speed counter stops and the routine proceeds to step S106. In step S106, the key release speed is calculated from the counter value of the key release speed counter and the routine proceeds to step S107. In step S107, a Note Off instruction that includes the key release speed information is transmitted to the sound source and the routine proceeds to step S110.

In step S108, a determination is made as to whether the key pressing speed counter is currently counting. In those cases where the counter is currently counting, the routine proceeds to step S109. In those cases where the counter is not currently counting, the routine proceeds to step S110. In step S109, the value of the key pressing speed counter is incremented and the routine proceeds to step S110. In step S110, the level of the phase output 211A is stored and the routine proceeds to step S111.

In step S111, the level change of the phase output 211B from the previous processing is determined. Incidentally, the level of the phase output 211B in the previous processing is stored in Step S120, which will be discussed later. In those cases where the current level is "0" and there has been no change from the previous processing, the routine proceeds to step S112. In those cases where the level has changed from "0" to "1," the routine proceeds to step S114. In those cases where the level has changed from "1" to "0," the routine proceeds to step S118. In those cases where the level is "1" and has not changed from the previous processing, the routine proceeds to step S120.

In step S112, a determination is made as to whether the key release speed counter is currently counting. In those cases where the counter is currently counting, the routine proceeds to step S113. In those cases where the counter is not currently counting, the routine proceeds to step S120. In step S113, the value of the key release speed counter is incremented and the routine proceeds to step S120.

In step S114, a determination is made as to whether the key pressing speed counter is currently counting. In those cases where the counter is currently counting, the routine proceeds to step S115. In those cases where the counter is not currently counting, the routine proceeds to step S120. In step S115, the counting of the key pressing speed counter stops and the routine proceeds to step S116. In step S116, the key pressing speed is calculated from the counter value of the key pressing speed counter and the routine proceeds to step S117. In step S117, a Note On instruction that includes the key pressing speed information is transmitted to the sound source and the routine proceeds to step S120.

In step S118, the value of the key release counter is cleared and the routine proceeds to step S119. In step S119, the counting by the key release speed counter is started and the routine proceeds to step S120. In step S120, the level of the phase output 211B is stored and the processing ends.

When the key has not been pressed and the key pressing depth is at the key pressing starting point P0, the levels of the phase output 211A and the phase output 211B are "0." In this case, the key pressing speed counter is not currently counting and the key release counter is not currently counting. Therefore, the processing of step S101, step S110, step S111, step S112, and step S120 is carried out and only the processing that stores the phase output at that point is done. When the key is pressed, but the key pressing depth has not reached the first key pressing depth P1, because the levels of the phase output 211A and the phase output 211B do not change until the key pressing depth reaches the first key pressing depth P1, the same processing is performed.

At the time that the key pressing depth has reached the first key pressing depth P1, the level of the phase output 211A, but not the level of the phase output 211B, changes from "0" to "1." Therefore, the processing of step S102 and step S103 is carried out and the counting of the key pressing speed is started. When the key pressing depth is between the first key pressing depth P1 and the second key pressing depth P2 during the key pressing speed counting, the level of the phase output 211A is "1." Therefore, the value of the key pressing speed counter is incremented by the processing of step S109.

When the key pressing advances and the key pressing depth has reached the second key pressing depth P2, the level of the phase output 211B changes from "0" to "1." Therefore, the processing of step S114 through step S117 is carried out, the key pressing speed count stops, the key pressing speed is calculated from the count value of the key pressing speed counter, and a Note On instruction that includes the key pressing speed information is output to the sound source. When the key pressing depth has passed the second key pressing depth P2, the levels of the phase output 211A and the phase output 211B are "1." In this case, neither the key pressing speed counter nor the key release speed counter are currently counting. Therefore, only the processing that stores the phase output at that point is carried out by step S110, step S111, and step S120.

When the key releasing is started and the key pressing depth has reached the second key pressing depth P2, the level of the phase output 211B changes from "1" to "0." Therefore, the processing of step S118 and step S119 is carried out and the key release speed counting starts. When the key pressing depth is between the second key pressing depth P2 and the first key pressing depth P1, during the key release speed counting, the level of the phase output 211B is "0." Therefore, the value of the key release speed counter is incremented by the processing of S113.

When the key releasing advances and the key pressing depth has reached the first key pressing depth P1, the level of the phase output 211A changes from "1" to "0." Therefore, the processing of step 104 through step 107 is carried out, the key release speed counting stops, the key release speed is calculated from the count value of the key release speed counter, and a Note Off instruction that includes the key release speed information is output to the sound source.

Thus, in various embodiments, the alternating signals, the voltages of which are balanced and the phases of which are inverted, are applied to the two transmission electrodes, and the change in the phase is detected by the boundary of the two transmission electrodes passing in proximity to the reception electrode so that an accurate key pressing depth can be detected. If there is a disparity in the electrode gap due to variations in temperature or the mechanical precision and the like, the capacitance changes and this leads to fluctuations in the detected voltage. However, with phase detection, because what is detected is not the voltage of the signal that is induced in the reception electrode, but rather the rapid change in the phase of the signal, it is possible to keep the effect of the detected voltage to the minimum.

With the prior art key operation speed detection methods that use induced voltage detection employing a single transmission electrode and a single reception electrode, because the value of an analog amount is derived, a high cost A/D (analog-digital) converter and the like is required. However, according to various embodiments, a simple digital phase comparator is used, and it is possible to configure the key operation speed detection device with a small scale integrated circuit.

In addition, with the prior art key operation speed detection methods that use induced voltage detection, changes in the detected voltage, due to variations in the temperature or the mechanical precision and the like, affect the key operation speed detection precision. However, according to various embodiments, the accurate key operation speed detection can be performed without being affected by the changes in the detection voltage.

In addition, in various embodiments, the single signal generation circuit 201 (FIG. 2) for applying the alternating signal is used in common for a plurality of keys. Furthermore, the logic integrated circuit 112 (FIG. 2) for determining the phase of the alternating signal that has been induced in the reception electrode is also used in common for a plurality of keys. Because of this, it is possible to detect the key operation speed with a simple configuration. In addition, in various embodiments, because a gap is disposed between the transmission electrodes and the reception electrodes, the key operation feeling is not affected.

Incidentally, if the length of the reception electrode is made longer in the direction of movement of the hammer 104 (FIG. 1), the phase transition of the signal that is induced in the reception electrode at the time that the reception electrode passes the boundary of the transmission electrodes becomes slower. This is because the signal that is induced in the reception electrode is determined in accordance with the ratio with respect to the areas of each of the transmission electrodes that face the reception electrode. Because of this, if the length of the reception electrode is made longer in the direction of movement of the hammer 104, the spatial resolution drops. On the other hand, if the length of the reception electrode is made longer in the direction of movement of the hammer 104, the level of the signal that is induced in the reception electrode increases. Thus, it is necessary to determine the length of the reception electrode and the precision of the keyboard mechanism in consideration of the effect on each other.

In various embodiments, because a gap is disposed between the transmission electrode and the reception electrode, the key operation feeling is not affected. However, even in those cases where the distance between the electrodes has been reduced by sandwiching an insulating body between the reception electrode and the transmission electrode, according to some embodiments, the two electrodes do not come into contact. In this case, one insulating body is sandwiched between the two electrodes or an insulating body covers a surface of each respective electrode. However, in both cases there is a possibility that the electrodes will move while contacting the insulating body or will move while the insulating bodies contact each other. Accordingly, an insulating body having a small coefficient of friction may be used to minimize any effect on the key operation feeling.

In a percussive stringed instrument such as a piano, the volume and timbre are determined upon the hammer striking the string (i.e., by the final speed of the hammer). However, in the case of an electronic musical instrument, the final speed of the hammer of an electronic musical instrument may be different from the hammer of a piano. Because of this, with an electronic musical instrument, in addition to the final speed of the key or the hammer, the initial speed may also be detected, and the sound generation may be controlled. In addition, in those cases where continued striking is done at a high speed, there are cases where the next key pressing is made before the key or the hammer returns to the initial position. Because of this, with the prior art methods in which a key switch is used, three or more contact points are disposed on the key and the initial speed and the final speed are both detected.

In various embodiments, there is one reception electrode and the transmission electrodes are increased to four. Four alternating signals are generated and by making the phase difference between adjacent transmission electrodes $\pi/2$, the operation speed of the key is detected at two key pressing depth intervals. In particular embodiments, the phase of the signal that is induced in the reception electrode (as will be discussed in detail later while referring to FIG. 10) rapidly changes three times, $\pi/2$ each. The initial key pressing speed is detected by measuring the time interval between the first phase change and the second phase change. In addition, the final key pressing speed is detected by measuring the time interval between the second phase change and the third phase change.

At the time that the reception electrode passes the boundary between the two adjacent transmission electrodes, the voltage that is induced in the reception electrode is as follows. The voltages that are applied to the two transmission electrodes are respectively made sin $\omega t$ and cos $\omega t$. The degree of the effect of the electrode to which the cos $\omega t$ voltage is applied on the reception electrode is made a (where 0<a<1). At this time, the degree of the effect of the electrode to which the sin $\omega t$ voltage is applied on the reception electrode is (1−a). Therefore, the voltage in which the effects of the two transmission electrodes have been synthesized is expressed as in equation 3:

$$(1-a)\sin \omega t + a \cos \omega t = \{1-2a(1-a)\}^{1/2} \sin(\omega t + \phi) \quad \text{[Equation 3]}$$

$\phi$ is shown in equation 4:

$$\phi = \arctan\{a/(1-a)\} \quad \text{[Equation 4]}$$

Figure 7:
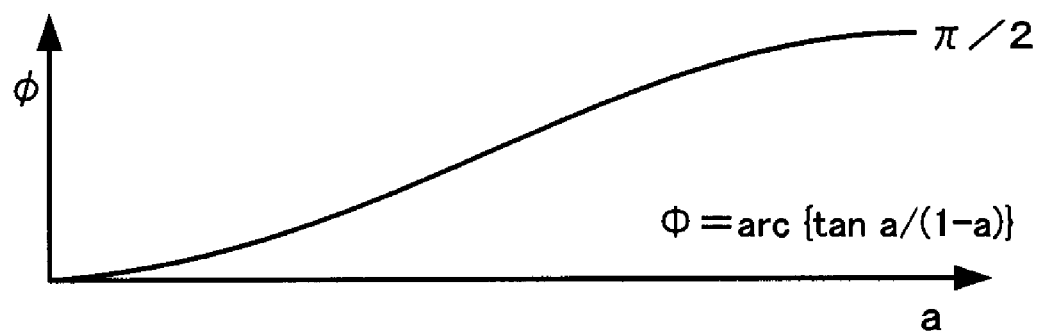
FIG. 7 is a drawing showing a relationship between a transmission electrode and a reception electrode and a phase according to an embodiment of the present invention.

The degree of the effect a of the electrode to which the cos $\omega t$ voltage is applied on the reception electrode changes is in a range of "0" to "1." Therefore, as is shown in equation 4, the phase $\phi$ of the voltage that is induced in the reception electrode changes in a range of "0" to "$\pi/2$." In FIG. 7, the relationship between the degree of effect a and the phase $\phi$ is shown.

In addition, as is shown in equation 3, the level of the voltage that is induced in the reception electrode changes from "1" to "$(1/(2^{1/2}))$," but does not become "0." The level of the voltage does not become "0" because the difference of the phase is $\pi/2$ (in contrast to the embodiments relating to FIGS. 1-6 for which the voltages that are applied to the adjacent transmission electrodes were mutually inverse phases). The advantage is that in this manner, the amplitude of the signal, which is induced in the reception electrode, does not become extremely small. Because of this, it is possible to distinguish the phase of the signal that is induced in the reception electrode with a greater degree of certainty.

FIGS. 8(a)-8(c) illustrate an internal configuration of a signal generation circuit 803, transmission electrodes 801A-801D, a reception electrode 802, and a logic integrated circuit 808. The signal generation circuit 803 is a circuit that generates a signal that is applied to the transmission electrode (e.g., 801A-801D). The logic integrated circuit 808 is a circuit that processes the signal that has been induced in the reception electrode (e.g., 802). In the following explanation, the same keys have been assigned to similar items previously discussed (unless otherwise noted) and their detailed explanation has been omitted.

In FIG. 8(a), a side view of the tip section 106 of the hammer 104 is shown. In FIG. 8(b), the signal generation circuit, the transmission electrodes, the reception electrode, and the logic integrated circuit that processes the signals are shown. In FIG. 8(c), an enlarged view of a portion of the wiring with which the transmission electrodes are connected is shown.

The rectangular transmission electrodes are furnished on the tip section 106 of the hammer 104 in the same manner as in the embodiments relating to FIGS. 1-6. However, in some embodiments, for example as shown in FIGS. 8(a)-8(c), the transmission electrode 801A, the transmission electrode 801B, the transmission electrode 801C, and the transmission electrode 801D are fixed with insulation at a prescribed interval in the order listed from the top along the direction of movement of the tip section 106 of the hammer 104. The rectangular reception electrode 802 is furnished on the speed detection circuit board 110 in the same manner as in the embodiments relating to FIGS. 1-6. However, as shown in FIGS. 8(a)-8(c), in some embodiments, there is only one reception electrode.

The signal generation circuit 803 is configured by a sine wave oscillator 804, a cosine wave oscillator 805, a balance boost transformer 806, and a balance boost transformer 807. The outputs from the sine wave oscillator 804 and the cosine wave oscillator 805 are respectively made into two high-voltage alternating signals by the balance boost transformer 806 and the balance boost transformer 807. Accordingly, the signal generation circuit 803 generates four high-voltage alternating signals, the phases of which differ by $\pi/2$. Incidentally, a quadrature oscillator that oscillates as a sine wave oscillator and a cosine wave oscillator with signals, the phases of which differ by $\pi/2$ is well known.

The alternating signals that are generated by the sine wave oscillator 804 and the cosine wave oscillator 805 are of the same voltage and have the same period. In addition, the step up ratios of the balance boost transformer 806 and the balance boost transformer 807, which have been connected to the two oscillators, are also set the same. Because of this, the voltages and the periods of the four alternating signals are identical.

The sine wave from the two alternating signals that have been output from the balance boost transformer 806 is supplied to the transmission electrode 801A and the –sine wave is supplied to the transmission electrode 801C. In addition, the cosine wave from the two alternating signals that have been output from balance boost transformer 807 is supplied to the transmission electrode 801B and the –cosine wave is supplied to the transmission electrode 801D. In other words, a sine wave is applied to the transmission electrode 801A, a cosine wave to the transmission electrode 801B, a –sine wave to the transmission electrode 801C, and a –cosine wave to the transmission electrode 801D. Accordingly, the phase difference between adjacent transmission electrodes becomes $\pi/2$ (90 degrees).

The wiring that supplies the alternating signals from the balance boost transformer 806 to the transmission electrode 801A and the transmission electrode 801C may be parallel wires or twisted pair wires as a pair. Because the signals that pass through the wiring are of mutually inverse phases, they mutually cancel each other and the radiation from the wiring may be reduced. In the same manner, the wiring that supplies the alternating signals from the balance boost transformer 807 to the transmission electrode 801B and the transmission electrode 801D may be parallel wires or twisted pair wires as a pair and the radiation from the wiring may be reduced. The radiation can be further reduced if the wiring is shielded.

Incidentally, because the signals that are output from the two balance boost transformers are four signals, the phases of which are each staggered by $\pi$, these signals mutually cancel each other when added. Accordingly, even when the four distributing wires that are output from the two balance boost transformers are put together as parallel wires or twisted pair wires, they mutually cancel each other and it is possible to reduce the undesirable radiation.

In FIG. 8(c), wiring 820A is connected to the transmission electrode 801A, wiring 820B is connected to the transmission electrode 801B, wiring 820C is connected to the transmission electrode 801C, and wiring 820D is connected to the transmission electrode 801D. The wiring 820A and the wiring 820C, which supply signals that have mutually inverse phases, are parallel wires in proximity to each other. In the same manner, the wiring 820B and the wiring 820D, which supply signals that have mutually inverse phases, are parallel wires in proximity to each other. In addition, a ground electrode 821 is disposed between the wiring 820C and the wiring 820D. The ground electrode 821 is connected to ground. By using such a configuration, the radiation from the wiring may be reduced.

With reference to FIGS. 8(a)-8(c), the alternating signals that have been induced in the reception electrode 802 are input to the positive side input terminal of a voltage comparator 809 of the logic integrated circuit 808. The negative side input terminal of the voltage comparator 809 is grounded as previously discussed (e.g., voltage comparator 206A, 206B in FIG. 2). The voltage comparator 809 converts the alternating signal to a logical level and produces a phase pulse 810. The phase pulse 810 is supplied to a gate 812 of a phase discriminator 811. The phase discriminator 811 detects the continuous phase changes. The phase discriminator 811 includes the gate 812, a counter 813, and a register 814.

The phase pulse 810, the standard phase signal 210, and a master clock 816 are provided to the gate 812. The standard phase signal 210 here is a signal in which the signal from the sine wave oscillator 804 has been converted into a logical level by the level converter 209. The master clock 816 is generated by a master clock oscillator 815.

The master clock 816 is passed through the gate 812 in the period from the leading edge of the phase pulse 810 to the leading edge of the standard pulse signal 210 to produce a gate output 817. The gate output 817 is supplied to a counter 813. The counter 813 counts the gate output 817 to obtain a count value. The counter 813 transfers to a register 814 the count value of the counter 813 at the time that the gate 817 has closed. The register 814 holds the count value of the counter 813 until this is read out from the microprocessor 212 as a phase output.

FIG. 9 illustrates the relationship between the master clock 816, the phase pulse 810, the standard phase signal 210, and the gate output 817. The gate output 817 is produced by the passing through of the master clock 816 in the period from the leading edge of the phase pulse 810 to the leading edge of the standard phase pulse 210. Therefore, the more the phase of the phase pulse 210 is advanced with respect to the phase of the standard pulse 210, the more the pulse count of the gate output 817. It is possible to detect the phase of the alternating signal that has been induced in the reception electrode 802 by counting the pulse count of the gate output 817.

Figure 8:
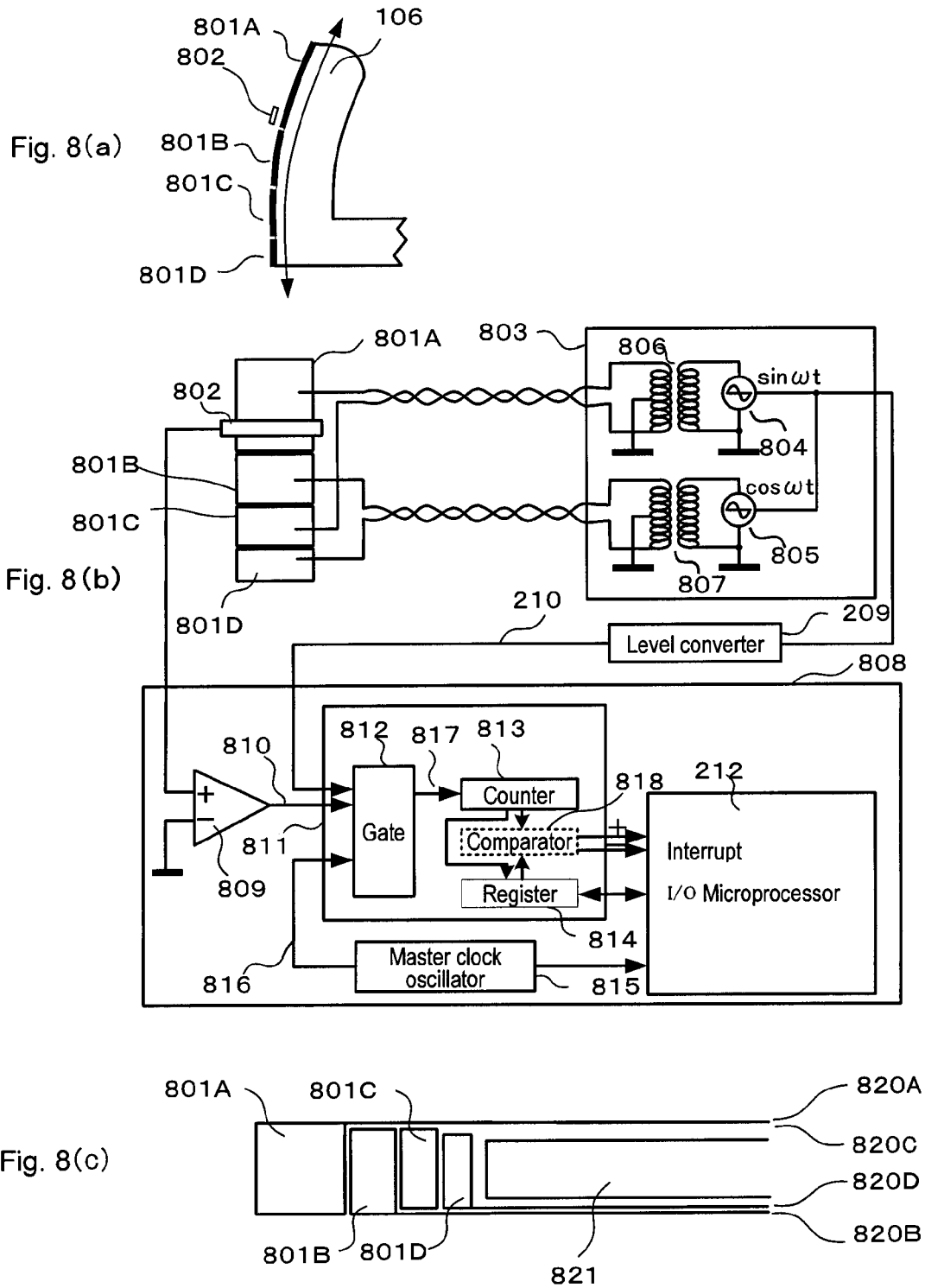
FIG. 8(a) is a side-view drawing of a tip section of a hammer according to an embodiment of the present invention.
FIG. 8(b) is a drawing of a signal generation circuit, a transmission electrode, a reception electrode, and a logic integrated circuit according to an embodiment of the present invention.
FIG. 8(c) is an expanded drawing of a portion of a connection that connects to a transmission electrode according to an embodiment of the present invention.

FIG. 10 illustrates the phase of the alternating signal that is induced in the reception electrode 802 (FIGS. 8(*a*) and 8(*b*)) at the time that the key pressing depth has changed. In FIG. 10, the phase of a sine wave is the standard phase. A key pressing depth P1, the position at which the reception electrode 802 passes through the boundary of the transmission electrode 801A and the transmission electrode 801B, is shown. A key pressing depth P2, the position at which the reception electrode 802 passes through the boundary of the transmission electrode 801B and the transmission electrode 801C, is shown. A key pressing depth P3, the position at which the reception electrode 802 passes through the boundary of the transmission electrode 801C and the transmission electrode 801D, is shown.

With reference to FIGS. 8(*a*)-10, the signal sin ωt that has been applied to the transmission electrode 801A during the key pressing standby is induced in the reception electrode 802. The phase that is detected at this time is "0." Until the key pressing is started and the key pressing depth reaches P1, the phase that is detected remains as it is unchanged at "0." When the key pressing advances and the reception electrode 802 passes through the boundary of the transmission electrodes 801A and 801B, the signal sin ωt that is induced from the transmission electrode 801A rapidly diminishes and the signal cos ωt that is induced from the transmission electrode 801B rapidly increases. The phase that is detected at this time rapidly changes from "0" to "π/2." In the same manner after this, the phase is "π/2" until the key pressing depth reaches P2 and changes from "π/2" to "π" when the key pressing depth passes through P2. In addition, the phase is "π" until the key pressing depth reaches P3 and changes from "π" to "3π/2" when the key pressing depth passes through P3.

The microprocessor 212 carries out processing at each specified time interval in the same manner as discussed above (refer to FIGS. 1-6) and detects the key pressing speed by measuring the interval of time in which the phase changes by π/2 based on the phase output. In other words, the initial key pressing speed can be derived from the interval of time when the key pressing depth changes from P1 to the key pressing depth P2. In addition, the final key pressing speed may be derived from the interval of time when the key pressing depth changes from P2 to the key pressing depth P3.

Furthermore, the average key pressing speed can be derived from the average of the initial key pressing speed and the final key pressing speed. These key pressing speeds are utilized, for example, as follows. In those cases where the key pressing has been started from the initial position, the sound generation is controlled by the average key pressing speed. On the other hand, in those cases where, because of continued striking, the key pressing starts from between the key pressing depth P1 and the key pressing depth P2, the sound generation is controlled by the final speed of the key pressing.

Figure 11:
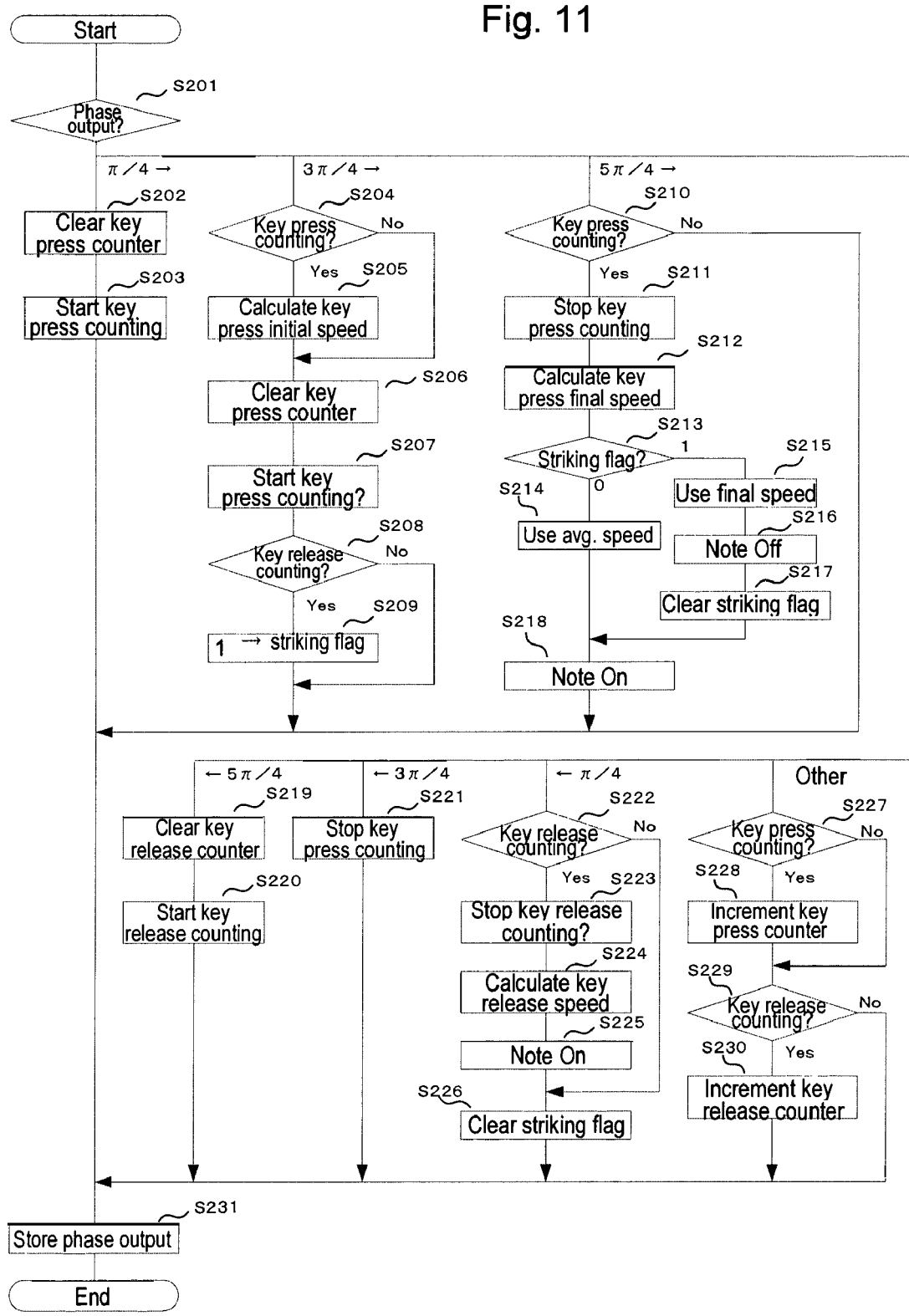
FIG. 11 is a flowchart of processing carried out by a microprocessor according to an embodiment of the present invention.

FIG. 11 illustrates processing carried out by the microprocessor 212 (e.g., FIG. 8(*b*)). Although the processing is carried out for a plurality of keys, for simplification, the process for only one key is discussed. This processing is launched repeatedly for each specified period. In addition, the variables that are used in the processing are initialized when the power is turned on by processing that is not shown in the drawing.

With reference to FIGS. 8(*a*)-11, in step S201, the phase output value that is stored in the register 814 is read, and the change from the phase output value of the previous processing is determined. Incidentally, the phase output value in the previous processing is stored in Step S231, which will be discussed later. In those cases where the phase has increased passing through "π/4," the routine proceeds to step S202. In those cases where the phase has increased passing through "3π/4," the routine proceeds to step S204. In those cases where the phase has increased passing through "5π/4," the routine proceeds to step S210. In those cases where the phase has decreased passing through "5π/4," the routine proceeds to step S219. In those cases where the phase has decreased passing through "3π/4," the routine proceeds to step S221. In those cases where the phase has decreased passing through "π/4," the routine proceeds to step S222. In cases other than these, the routine proceeds to step S227.

Incidentally, in FIG. 11, for example, "those cases where the phase has increased passing through 'π/4'" is expressed as "π/4→." In addition, "those cases where the phase has decreased passing through 'π/4'" is expressed as "←π/4." In other words, the number indicates the phase that is passed through. Furthermore, when there is a "→" to the right of the number, this indicates that there has been an increase, and when there is a "←" to the left of the number, this indicates that there has been a decrease.

In step S202, the value of the key pressing speed counter is cleared and the routine proceeds to step S203. In step S203, the counting by the key pressing speed counter starts and the routine proceeds to step S231.

In step S204, a determination is made whether the key pressing speed counter is currently counting. If the counter is currently counting, the routine proceeds to step S205. If the counter is not currently counting, the routine proceeds to step S206. In step S205, the initial key pressing speed is calculated from the count value of the key pressing speed counter and stored. The routine then proceeds to step S206.

In step S206, the count value of the key pressing speed counter is cleared and the routine proceeds to step S207. In step S207, the counting by the key pressing speed counter starts and the routine proceeds to step S208. In step S208, a determination is made whether the key release speed counter is currently counting. If the counter is currently counting, the routine proceeds to step S209. If the counter is not currently counting, the routine proceeds to step S231. In step S209, "1" is set to a continued striking flag and the routine proceeds to step S231. "1" indicates that there is continued striking processing.

In step S210, a determination is made whether the key pressing speed counter is currently counting. If the counter is currently counting, the routine proceeds to step S211. If the counter is not currently counting, the routine proceeds to step S231. In step S211, the counting by the key pressing speed counter stops and the routine proceeds to step S212. In step S212, the final key pressing speed is calculated from the count value of the key pressing speed counter and the routine proceeds to step S213.

In step S213, in those cases where the continued striking flag is "0," which indicates that there is no continued striking processing, the routine proceeds to step S214. In those cases where the continued striking flag is "1," which indicates that there is continued striking processing, the routine proceeds to step S215. In step S214, the average of the initial speed and the final speed is made the key pressing speed and the routine proceeds to step S218.

In step S215, the final speed is made the key pressing speed and the routine proceeds to step S216. In step S216, a Note Off instruction that contains the key release speed information is output to the sound source and the routine proceeds to step S217. Incidentally, the value of the key release speed information at this time is the middle value of the key release speed range. In step S217, the continued striking flag is cleared and the routine proceeds to step S218. In step S218, a Note On instruction that contains the key pressing speed information that was derived in step S214 or step S215 is transmitted to the sound source and the routine proceeds to step S231.

In step S219, the value of the key release speed counter is cleared and the routine proceeds to step S220. In step S220, the counting by the key release speed counter starts and the routine proceeds to step S231.

In step S221, the counting by the key pressing speed counter stops and the routine proceeds to step S231.

In step S222, a determination is made whether the key release speed counter is currently counting. In those cases where the counter is currently counting, the routine proceeds to step S223. In those cases where the counter is not currently counting, the routine proceeds to step S226. In step S223, the counting by the key release speed counter stops and the routine proceeds to step S224. In step S224, the key release speed is calculated from the count value of the key release speed counter and the routine proceeds to step S225. In step S225, a Note Off instruction that contains the key release speed information that was derived is transmitted to the sound source and the routine proceeds to step S226. In step S226, the continued striking flag is cleared and the routine proceeds to step S231.

In step S227, a determination is made whether the key pressing speed counter is currently counting. In those cases where the counter is currently counting, the routine proceeds to step S228. In those cases where the counter is not currently counting, the routine proceeds to step S229. In step S228, the value of the key pressing speed counter is incremented and the routine proceeds to step S229. In step S229, a determination is made whether the key release speed counter is currently counting. In those cases where the counter is currently counting, the routine proceeds to step S230. In those cases where the counter is not currently counting, the routine proceeds to step S231. In step S230, the value of the key release speed counter is incremented and the routine proceeds to step S231. In step S231, the current phase output value is stored and the processing ends.

When the key pressing is started and the key pressing depth has passed through P1, the key pressing speed counting is started by the processing of step S202 and step S203. In the period until the key pressing depth passes through P2, the value of the key pressing speed counter is incremented by the processing of step S228. When the key pressing depth has passed through P2, the initial key pressing speed is derived from the value of the key pressing counter by the processing of steps S204 through S207 and the key pressing speed counting is started again.

In the period until the key pressing depth passes through P3, the value of the key pressing speed counter is incremented by the processing of step S228. When the key pressing depth has passed through P3, the processing of steps S210 through S212 derives the final key pressing speed. In those cases where the key pressing depth has changed in the order of P1→P2→P3, a determination is made by step S213 that there is no continued striking. As a result, the average value of the initial key pressing speed and the final speed is made the key pressing speed by the processing of step S214, and a Note On is instructed to the sound source by step S218.

When the key releasing is started and the key pressing depth has passed through P3, the key release speed counting is started by the processing of step S219 and step S220. In the period until the key pressing depth passes through P1, the value of the key release speed counter is incremented by the processing of step S230. When the key pressing depth has passed through P1, the processing of steps S222 through S225 derives the key release speed from the value of the key release counter, and a Note Off is instructed to the sound source.

Incidentally, compared to the key pressing operation, sensitive speed control is difficult to carry out for the key release operation. Therefore, the key release speed information that is contained in the Note Off instruction is derived based on the time passed by the key pressing depth from P3 to P1.

In those cases where the key is released, the key pressing depth passes through P2, and the key has again been pressed before passing through P1, the processing of steps S208 and S209 sets the continued striking flag when the key pressing depth has passed through P2. After that, when the key pressing depth has passed through P3, a determination is made by the processing of step S213 that there is continued striking, and the final key pressing speed is used as the key pressing speed by the processing of step S215. Then, in step S216, a Note Off for the sound that is being generated is instructed to the sound source. Following that, in step S218, a new Note On is instructed to the sound source with regard to the key pressing.

As discussed, in various embodiments, the microprocessor 212 periodically monitors the phase output value that had been stored in the register 814 and detects the passing of the key pressing depth through a specified point. In other embodiments, an interrupt is applied to the microprocessor 212 when the value that is stored in the register 814 has passed a value that corresponds to a specified key pressing depth point. The microprocessor 212 carries out the processing in conformance with this interrupt. In this case, three values can be stored in the register 814, and the setting of the value of the counter 813 to the register 814 is stopped. Instead of this, the values may be set from the microprocessor 212 that correspond to the key pressing depth P1, the key pressing depth P2, and the key pressing depth P3.

In addition, the comparator 828 is disposed between the counter 813 and the register 814. When the comparator 818 has detected which of the values (that have been set in the register 814) is exceeded by the value of the counter 813, the interrupt is applied to the microprocessor 212. At this time, the comparator 818 retains the information that indicates whether the value of the counter 813 has changed in the increasing direction or has changed in the decreasing direction and, in addition, which of the values that correspond to the key pressing depths has been exceeded by the value of the counter 813. The microprocessor 212 reads out the information that is retained in the comparator 818 and carries out the appropriate processing. In such embodiments, because the periodic monitoring of the value of the phase output is not necessary, the processing load on the microprocessor 212 is lightened.

In a percussive stringed instrument, such as a piano, the volume and timbre are determined upon the hammer striking the string (i.e., by the final speed of the hammer). However, there are cases in which the initial speed of the key and the key pressing depth, and the pressing force after pressing the key (the aftertouch) affect the sound generation. In addition, with a synthesizer, affecting the timbre based on the initial speed, the key pressing depth, and the aftertouch is desirable. In a case such as this, the detection of not only the final speed of the hammer, but the continuous detection of the position and speed of the entire stroke of the key is desirable. In addition, in embodiments relating to FIGS. 1-6 and FIGS. 7-11, the section in which the operating speed of the key is measured is determined by the boundary position of the transmission electrodes and is fixed at the time of the design. In other embodiments, the section in which the operating speed of the key is measured may be freely changed depending on the performed melody and the preferences of the performer.

In some embodiments, it is possible to detect the pressing depth of the key at a point in time across the entire stroke of the key. In the embodiments relating to FIGS. 1-6 and FIGS. 7-11, the boundary between the transmission electrodes is disposed in the direction that is perpendicular to the direction of movement of the hammer. FIGS. 12(*a*) and 12(*b*) illustrate the basic structure of the transmission electrodes that are used according to various embodiments. A transmission electrode 1201 is disposed on the tip section 106 of the hammer 104 as in the embodiments relating to FIGS. 1-6 and FIGS. 7-11. However, in the embodiments of FIGS. 12(*a*) and 12(*b*), the boundary between the transmission electrodes is sloped (i.e., less than 90 degrees) with respect to the direction of movement of the hammer. Transmission electrodes 1201A and 1201B, which have been formed from wedge-shaped copper foil, are disposed on the tip section 106 of the hammer 104. In other words, the width of one of the transmission electrodes gradually widens with respect to the direction of movement of the hammer 104. In addition, the width of the other transmission electrode, which is adjacent to that transmission electrode, gradually decreases with respect to the direction of movement of the hammer 104. In the above-mentioned structure, the alternating signal of a sine wave is applied to the transmission electrode 1201A, and the alternating signal of a cosine wave is applied to the transmission electrode 1201B. When the reception electrode 802 approaches and moves relative to the transmission electrodes 1201A, 1201B, the phase of the signal induced in the reception electrode 802 will change continuously by $\pi/2$ (90 degrees).

In FIGS. 13(*a*) and 13(*b*), the signal generation circuit that generates the signals that are applied to the transmission electrodes, the transmission electrodes, and the reception electrode are shown. In these figures, the number of transmission electrodes is four. In this case, compared to the case in which the number of transmission electrodes is two, the amount of phase change is magnified threefold. In the explanation below, a detailed explanation regarding the items that perform the same actions as those in the embodiments of FIGS. 1-6 and 7-11 is omitted.

FIG. 13(*a*) illustrates the tip section 106 of the hammer 104, the transmission electrode 1301, and the reception electrode 802. FIG. 13(*b*) illustrates the transmission electrode 1301 and the reception electrode 802 from the front.

The reception electrode 802 is, as described above, fixed horizontally on the speed detection circuit board of the keyboard base. The transmission electrode 1301 includes transmission electrode 1301A, transmission electrode 1301B, transmission electrode 1301C, and transmission electrode 1301D. The boundaries between the adjacent transmission electrodes slope with respect to the direction of movement of the hammer. The transmission electrode 1301A is arranged at the top of the transmission electrode 1301.

The width of the transmission electrode 1301A gradually decreases as the electrode moves down toward the bottom of the transmission electrode 1301. The width of the transmission electrode 1301B gradually increases. The width of the transmission electrode 1301B gradually decreases downward from the location that the transmission electrode 1301A has discontinued; and, conversely, the width of the transmission electrode 1301C gradually increases. The width of the transmission electrode 1301C gradually decreases downward from the location that the transmission electrode 1301B has discontinued; and, conversely, the width of the transmission electrode 1301D gradually increases. The electrodes that were shown in FIG. 12 were wedge shaped. However, with reference to FIGS. 13(*a*) and 13(*b*), the transmission electrode 1301A and the transmission electrode 1301D are wedge shaped, and the transmission electrode 1301B and the transmission electrode 1301C are trapezoidal.

The reception electrode 802 is affected by each of the respective electric fields of the transmission electrodes 1301A-1301D that are generated by the movement of the tip 106 of the hammer up and down. The signal generation circuit generates four alternating signals. In addition, a sine wave is applied to the transmission electrode 1301A, a cosine wave is applied to the transmission electrode 1301B, a −sine wave is applied to the transmission electrode 1301C, and a −cosine wave is applied to the transmission electrode 1301D.

Figures 13A, 13B, 14:
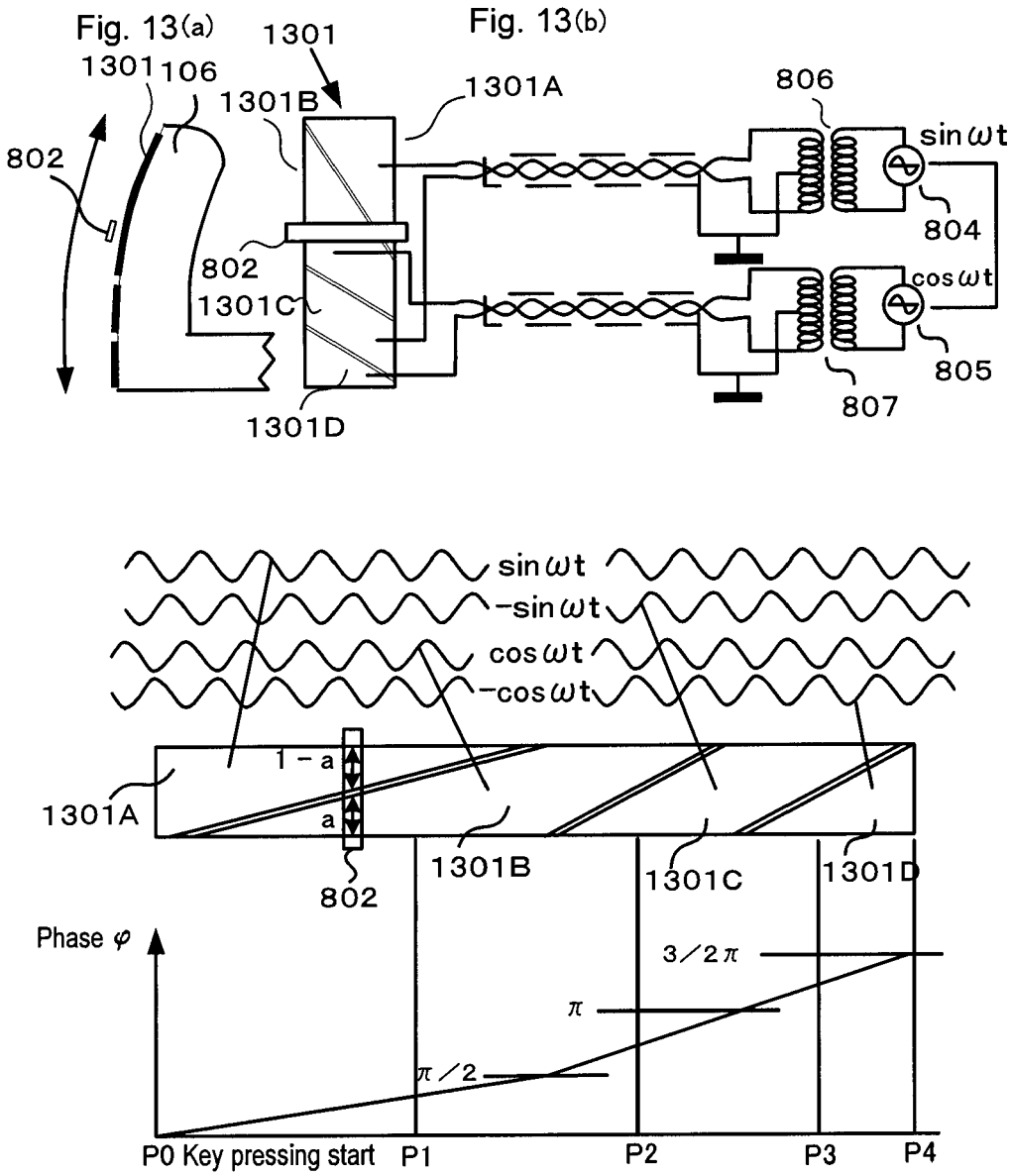
FIG. 13(a) is a side-view drawing of a tip section of a hammer according to an embodiment of the present invention.
FIG. 13(b) is a drawing showing a signal generation circuit, a transmission electrode, and a reception electrode according to an embodiment of the present invention.
FIG. 14 is a drawing showing a state of a phase when a signal is applied to a transmission electrode and key pressing depth has changed according to an embodiment of the present invention.

In FIG. 14, the signals that are applied to each of the transmission electrodes, and the phase of the alternating signal that is induced in the reception electrode 802 when the key pressing depth has changed are shown. In FIG. 14, the phase of a sine wave is the standard phase. In the lowermost section of FIG. 14, the key pressing depth is shown on the horizontal axis and the phase of the alternating signal that is induced in the reception electrode 802 is shown on the vertical axis.

The a (0<a<1) shown in FIG. 14, indicates the degree of the effect of the transmission electrode 1301A on the reception electrode 802 (FIG. 13) when the reception electrode 802 is in a position that faces the transmission electrode 1301A. The degree of the effect of the transmission electrode 1301B on the reception electrode 802 at this time is expressed as "1−a." As the reception electrode 802 moves toward the right (in FIG. 14), the width of the transmission electrode 1301A that faces the reception electrode decreases and the width of the transmission electrode 1301B increases. The phase of the voltage that is induced in the reception electrode 802 at this time changes in accordance with equation 3 and equation 4. The aspect of the change in the phase is shown in the lowermost section of FIG. 14.

At the time that the reception electrode 802 is at the position of the key pressing start point P0, the reception electrode 802 is affected only by the transmission electrode 1301A and the voltage of sin ωt is induced. As the reception electrode 802 moves relatively to the right side of the drawing, the width of the transmission electrode 1301A that faces the reception electrode 802 decreases; and conversely the width of the transmission electrode increases. As a result, the effect of sin ωt diminishes; and, conversely, the effect of cos ωt increases, and the phase that is induced in the reception electrode 802 gradually advances. When the reception electrode 802 has come to the position at which the transmission electrode 1301A discontinues, the voltage of cos ωt is induced in the reception electrode 802 and the phase advances "π/2" compared to the standard phase sin ωt. When the reception electrode 802 moves further to the right side, the width of the transmission electrode 1301B that faces the reception electrode 802 decreases and the width of the transmission electrode 1301C increases. Together with this, the phase changes from "π/2" to "π" compared to sin ωt. In the same manner, the phase changes from "π" to "3π/2" in the interval until the reception electrode 802 arrives at the right edge.

The time interval at which the key pressing depth P1, the key pressing depth P2, and the key pressing depth P3 are passed through is measured, and the operating speed of the key is derived as described with respect to FIGS. 7-11. With reference to FIGS. 12(*a*)-14, the key pressing depth P1, the key pressing depth P2, and the key pressing depth P3 can be changed in accordance with the preferences of the performer.

In addition, the depth of the key pressing may be detected continuously, and may be used to embellish the timbre of the generated sound.

Incidentally, as shown in FIG. 7, the relationship between the degree of the effect of the two transmission electrodes on the reception electrode and the detected phase is a curve. As shown in FIG. 14, the relationship between the two transmission electrodes on the reception electrode and the detected phase is substantially linear. However, by revising the shape of the transmission electrode or referring to a table that has been calculated in advance and correcting the phase that has been detected, it is possible to make the relationship between the two transmission electrodes on the reception electrode and the detected phase of FIG. 7 linear. In addition, for the circuit with which the signal that has been induced in the reception electrode is processed and the phase discrimination carried out, it is possible to use the circuit that is the same as that shown in FIG. 8 and the explanation is omitted.

Figure 15:
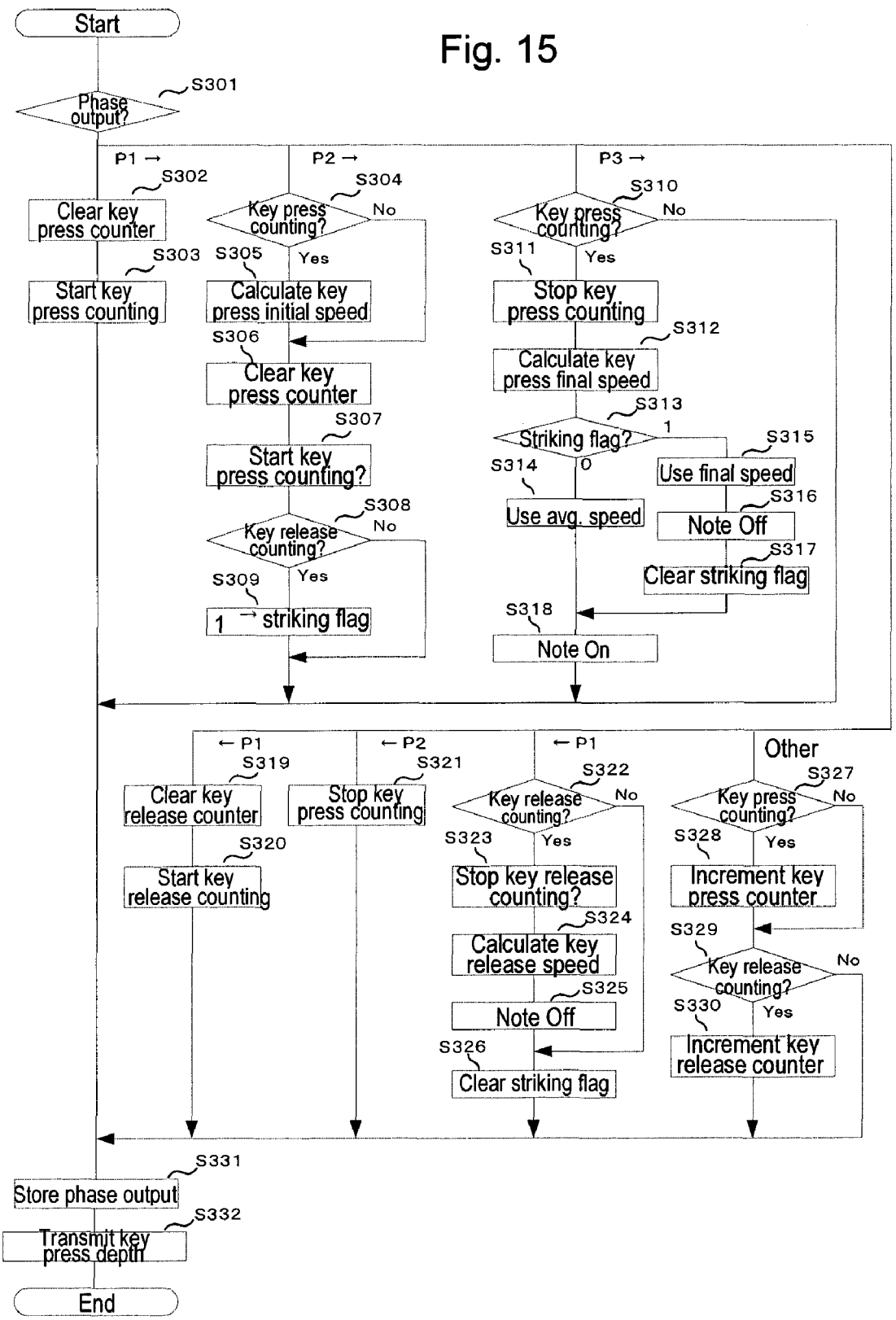
FIG. 15 is a flowchart of processing carried out by a microprocessor according to an embodiment of the present invention.

FIG. 15 illustrates processing carried out by the microprocessor 212 (e.g., FIG. 8(b)). Although the processing is carried out for a plurality of keys, for simplification, the process for only one key is discussed. This processing is launched repeatedly for each specified period. In addition, the variables that are used in the processing are initialized when the power is turned on by processing that is not shown in the drawing. Because the processing that is shown in FIG. 15 is virtually the same as the processing shown in FIG. 11, an explanation will be given only of the areas of difference.

With reference to FIG. 15, in step S301, the phase output value that is stored in the register 814 is read and a determination is made of the change in the phase output value from the previous processing. In step S201 of FIG. 11, the current phase value is compared with a fixed phase value. However, in the processing shown in FIG. 15, the current phase value is compared with a phase value that has been set arbitrarily as desired. The phase value that is the target of the comparison is set in advance by separate processing (not shown) in conformance with the key pressing depth P1, the key pressing depth P2, and the key pressing depth P3 (FIG. 14) that are specified by the performer. In FIG. 15, the phase value that is the target of the processing is expressed as "P1," "P2," and "P3."

In addition, in contrast to the processing shown in FIG. 11, the processing of FIG. 15 includes step S332. In step S332, the current phase value is converted into a key pressing depth based on the relationship between the key pressing depth and the phase value (shown in the lower portion of FIG. 14). In addition, information indicating the key pressing depth is transmitted to the sound source. In the sound source, the timbre is embellished during the sound generation based on the information indicating the key pressing depth.

With reference to FIGS. 12(a)-15, the microprocessor 212 (e.g., FIG. 8(b)) continuously monitors the phase value that has been detected across the entire stroke of the key pressing. Therefore, it is possible to transmit not only the operating speed of the key but also the depth of the key pressing continuously to the sound source. In addition, the position of the deepest portion (the aftertouch) of P3 to P4, which are the key pressing depths after the start of the sound generation, can be transmitted continuously to the sound source.

In the embodiments shown relating to FIGS. 1-6 and 7-11, a plurality of rectangular transmission electrodes are arranged along the direction of movement of the hammer at a prescribed interval, and the phase of the signal that is induced in the reception electrode changes at the position of the boundary of the transmission electrode. In such embodiments, the local space precision is improved and the operating speed of the key is accurately calculated from the time for the passage between boundaries that have been fixed.

In contrast to this, in the embodiments relating to FIGS. 12(a)-15, the transmission electrodes are arranged such that the shape of the transmission electrode is wedge shaped or trapezoidal and the boundaries between the transmission electrodes are sloped with respect to the direction of movement of the hammer. As a result, the phase of the signal that is induced in the reception electrode changes continuously across the entire stroke of the key pressing. In other words, continuous detection of the depth of the key pressing can be achieved at the cost of a small loss in local resolution.

However, in some embodiments, the advantages of both sets of embodiments may be realized together. In such embodiments, wedge-shaped, trapezoidal, and rectangular transmission electrodes are combined appropriately, and the boundaries between the transmission electrodes are made sloping or in the perpendicular direction with respect to the direction of movement of the hammer.

FIG. 16 illustrates the transmission electrodes, the reception electrode, and the signal generation circuit. Transmission electrode 1601 includes wedge-shaped transmission electrode 1601A, trapezoidal transmission electrode 1601B, wedge-shaped transmission electrode 1601C, transmission electrode 1601D, transmission electrode 1601E, transmission electrode 1601F, and transmission electrode 1601G. The boundary between each of the transmission electrode 1601A and the transmission electrode 1601B, the transmission electrode 1601B and the transmission electrode 1601C, the transmission electrode 1601D and the transmission electrode 1601E, and the transmission electrode 1601F and the transmission electrode 1601G are sloped (i.e., less than 90 degrees) with respect to the direction of movement of the tip section 106 of the hammer. In addition, the boundary between the transmission electrode 1601C and the transmission electrode 1601D and boundary between the transmission electrode 1601E and the transmission electrode 1601F are perpendicular to the direction of movement of the tip section 106 of the hammer. The transmission electrode 1601A is arranged at the top of the transmission electrode 1601.

The width of the transmission electrode 1601A gradually decreases as the electrode moves down toward the bottom of the transmission electrode 1601, and, conversely, the width of the transmission electrode 1601B gradually increases. The width of the transmission electrode 1601B gradually decreases downward from the location that the transmission electrode 1601A has discontinued; and, conversely, the width of the transmission electrode 1601C gradually increases. Similarly, the widths of the transmission electrode change in the same manner. Below the transmission electrode 1601C, the transmission electrode 1601D and below the transmission electrode 1601E, the transmission electrode 1601F are arranged in order placed horizontally with a specified gap.

FIG. 17 illustrates the signals applied to each of the transmission electrodes and the phase of the alternating signal that is induced in the reception electrode 802 when the key pressing depth has changed. In FIG. 17, the phase of a sine wave is made the standard phase. The $\sin \omega t$ is applied to the transmission electrode 1601A, $\cos \omega t$ is applied to the transmission electrode 1601B, $-\sin \omega t$ is applied to the transmission electrode 1601C, $-\cos \omega t$ is applied to the transmission electrode 1601D, $\sin \omega t$ is applied to the transmission electrode 1601E, $\cos \omega t$ is applied to the transmission electrode 1601F, and $-\sin \omega t$ is applied to the transmission electrode 1601G. The boundary between the transmission electrode 1601C and the transmission electrode 1601D is the key pressing depth P2 and the boundary between the transmission electrode 1601E, and the transmission electrode 1601F is the key pressing depth P3. The phase of the signal that is induced in the interval from the key pressing start position P0 up to the key pressing depth P2 changes continuously. Around the key pressing depth P2, the phase of the signal that is induced changes abruptly. In the interval from the key pressing depth P2 up to the key pressing depth P3, the phase of the signal that is induced changes continuously. Around the key pressing depth P3, the phase of the signal that is induced changes abruptly. At a key pressing depth that is deeper than the key pressing depth P3, the phase of the signal that is induced changes continuously.

An accurate key pressing speed is measured in the interval of time between the key pressing depth P2 and the key pressing depth P3, where the phase transition is rapid. Since the processing and the flowchart correspond to the embodiments previously discussed (e.g., FIG. 15), an explanation is omitted.

Incidentally, in some embodiments, there are two or four alternating signals that are applied to a plurality of transmission electrodes. In other embodiments, the phase difference of the transmission electrodes is 2π/3 for three signals. When the three alternating signals are added, because they are mutually cancelled, it is possible to reduce radiation.

In some embodiments, the transmission electrodes are disposed on the hammer (which is a member that moves together with the key pressing) and the reception electrodes are disposed on the base of the keyboard mechanism. In other embodiments, the transmission electrodes and/or the reception electrodes may be arranged in any suitable configuration so that the areas of the two electrodes that are opposite each other change together with the key pressing. For example, arranged away from the hammer, on some other part that moves with the key or the key itself.

Figure 18:
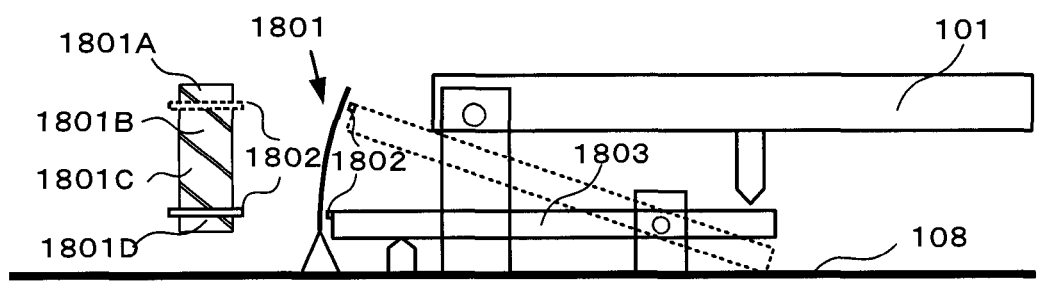
FIG. 18 is a drawing showing a key operation speed detection device according to an embodiment of the present invention.

As another example, as shown in FIG. 18, the transmission electrodes and the reception electrode may be swapped. In other words, transmission electrode 1801 may be disposed on the keyboard base 108 and reception electrode 1802 disposed on member 1803 that moves together with the pressing of the key. The speed detection circuit board on which the signal generation circuit 201 and the logic integrated circuit 112 have been mounted is disposed on the keyboard base 108. The transmission electrode 1801 includes transmission electrode 1801A, transmission electrode 1801B, transmission electrode 1801C, and transmission electrode 1801D. In addition, the reception electrode 1802 is arranged on the member 1803 that moves together with the key pressing so that the electrode faces the transmission electrode.

Incidentally, because the movement path of the reception electrode 1802 together with the key pressing is a curve, in order for the minimum distance between the transmission electrode 1801 and the reception electrode 1802 to be constant without regard to the key pressing depth, the transmission electrode 1801 may be curved along the curve of the movement of the reception electrode 1802. In accordance with the configuration of FIG. 18, because the distance from the signal generation circuit that has been disposed on the keyboard base to the transmission electrode 1801 is reduced, the radiation from the wiring can be reduced.

In addition, with regard to the length of the transmission electrode and the reception electrode in the direction of movement of the member that moves together with the key pressing, the reception electrode is smaller than the transmission electrode. Because of this, as shown in FIG. 18, in those cases where the reception electrode is disposed on the member that moves together with the key pressing, the size of the keyboard mechanism can be reduced.

Incidentally, in FIG. 18, wedge-shaped and trapezoidal transmission electrodes are shown, but it is possible for the shape of the transmission electrode to be rectangular as shown in FIG. 1(*a*) and FIG. 8(*b*). In this case, rather than disposing the transmission electrodes individually for each key independently, the transmission electrodes may be transmission electrodes that are common to a plurality of keys, having a length that extends over a plurality of keys in the direction of the array of the keys. In this case, the radiation from the transmission electrodes may increase. However, because the alternating signals (that are applied to the plurality of transmission electrodes) are added, their phase differences cancel each other, and thus the radiation of the transmission electrodes becomes negligible.

Incidentally, the reception electrode is disposed on the key side, and the wiring is extended from the reception electrode to the speed detection circuit board. Thus in some embodiments, shielding that is sandwiched by the ground line may be implemented on the wiring to inhibit radio waves from interfering the space near the wiring.

The embodiments disclosed herein are to be considered in all respects as illustrative, and not restrictive of the invention. The present invention is in no way limited to the embodiments described above. Various modifications and changes may be made to the embodiments without departing from the spirit and scope of the invention. The scope of the invention is indicated by the attached claims, rather than the embodiments. Various modifications and changes that come within the meaning and range of equivalency of the claims are intended to be within the scope of the invention.

What is claimed is:

1. A key operation speed detection device for an electronic musical instrument having a plurality of keys comprising:
   one or more reception electrodes, each of the one or more reception electrodes corresponding to a key of the plurality of keys;
   two or more transmission electrodes facing each of the one or more reception electrodes;
   a keyboard device configured to move one of the one or more reception electrodes and the two or more transmission electrodes relative to the other of the one or more reception electrodes and two or more transmission electrodes to change a capacitance between the one or more reception electrodes and the two or more transmission electrodes;
   a signal generation circuit associated with at least some of the plurality of keys, the signal generation circuit configured to generate a plurality of alternating signals, each of the alternating signals having the same period and a different phase from each other, the signal generation circuit configured to supply each of the alternating signals to a respective one of the transmission electrodes to induce a respective detection signal, the signal generation circuit configured to generate a standard phase signal having the same period as the alternating signals; and
   a signal processing circuit associated with at least some of the plurality of keys, the signal processing circuit configured to determine a pressing depth of the key based on the standard phase signal and the detection signals, and the signal processing circuit configured to determine an operating speed of the key based on a time interval in which the key passes at least two pressing depths.

2. The device of claim 1, wherein a gap is arranged between the one or more reception electrodes and the two or more transmission electrodes.

3. The device of claim 2, wherein the alternating signals have a voltage having a greater magnitude than the standard phase signal.

4. The device of claim 3, wherein at least one of the two or more transmission electrodes and the one or more reception electrodes are covered by an insulating layer.

5. The device of claim 3, further comprising:
wiring for supplying the plurality of alternating signals as a pair to the two or more transmission electrodes;
wherein the wires comprise one of parallel wires, twisted pair wires, and shielded wiring,
wherein the phases of the alternating signals differ by $\pi$.

6. The device of claim 3, further comprising:
wiring for supplying the plurality of alternating signals as a pair to the two or more transmission electrodes;
wherein the wires comprise one of parallel wires, twisted pair wires, and shielded wiring; and
wherein the phases of the plurality of alternating signals have a phase such that the plurality of alternating signals is cancelled out.

7. The device of claim 1,
the one or more reception electrodes comprising a plurality of reception electrodes corresponding to each key of the plurality of keys;
the two or more transmission electrodes comprising two transmission electrodes;
wherein the signal generating circuit is configured to supply two alternating signals, the phases of which mutually differ by $\pi$, respectively to the two transmission electrodes; and
the signal processing circuit configured to determine the operating speed of the key based on the time interval for the phase inversion by the alternating signals from at least two reception electrodes of the plurality of reception electrodes for each key of the plurality of keys.

8. The device of claim 1,
the one or more reception electrodes comprising one reception electrode corresponding to each key of the plurality of keys;
the two or more transmission electrodes comprising two transmission electrodes;
the signal processing circuit configured to determine the operating speed of the key based on the time interval when the phase of the alternating signal from the reception electrode of each key becomes identical to at least two specified phases.

9. The device of claim 1,
wherein the two or more transmission electrodes are arranged on the key or a member connected to the key; and
wherein the one or more reception electrodes and the signal processing circuit are arranged on a base of the keyboard device.

10. The device of claim 1,
wherein the one or more reception electrodes are arranged on the key or a member connected to the key; and
wherein the one or more transmission electrodes and the signal generation circuit are arranged on a base of the keyboard device.

11. The device of claim 10, further comprising:
wiring for supplying the alternating signals to the signal processing circuit, the wiring having shielding that is sandwiched by a ground line.

12. A detection device for detecting a key operation of an electronic musical instrument having a plurality of keys, the device comprising:
one or more reception electrodes, each of the one or more reception electrodes corresponding to a key of the plurality of keys;
two or more transmission electrodes facing each of the one or more reception electrodes;
a key element configured to move one of the one or more reception electrodes and the two or more transmission electrodes relative to the other of the one or more reception electrodes and two or more transmission electrodes to change a capacitance between the one or more reception electrodes and the two or more transmission electrodes;
a signal generation circuit associated with at least some of the plurality of keys, the signal generation circuit configured to generate a plurality of alternating signals, each of the alternating signals having the same period and a different phase from each other, the signal generation circuit configured to supply each of the alternating signals to a respective one of the transmission electrodes to induce a respective detection signal, the signal generation circuit configured to generate a standard phase signal having the same period as the alternating signals; and
a signal processing circuit associated with at least some of the plurality of keys, the signal processing circuit configured to determine a pressing depth of the key based on the standard phase signal and the detection signals.

13. The detection device of claim 12, the signal processing circuit configured to determine an operating speed of the key based on a time interval in which the key moves from a first pressing depth to a second pressing depth.

14. The detection device of claim 13,
the one or more reception electrodes comprising two reception electrodes corresponding to the key, the two reception electrodes comprising a first reception electrode and a second reception electrode;
wherein the first pressing depth corresponds to a change in the detected signal of the first reception electrode; and
wherein the second pressing depth corresponds to a change in the detected signal of the second reception electrode.

15. The detection device of claim 12, wherein a gap is arranged between the one or more reception electrodes and the two or more transmission electrodes.

16. The detection device of claim 12, wherein the alternating signals have a voltage having a greater magnitude than the standard phase signal.

17. The detection device of claim 12, wherein at least one of the two or more transmission electrodes and the reception electrodes are covered by an insulating layer.

18. The detection device of claim 12, wherein the phases of the alternating signals differ by $\pi$.

19. The detection device of claim 12, wherein the phases of the plurality of alternating signals have a phase such that the plurality of alternating signals is cancelled out.

20. The detection device of claim 12,
the one or more reception electrodes comprising a plurality of reception electrodes corresponding to each key of the plurality of keys;
the two or more transmission electrodes comprising two transmission electrodes;
wherein the signal generating circuit is configured to supply two alternating signals, the phases of which mutually differ by $\pi$, respectively to the two transmission electrodes; and
the signal processing circuit configured to determine the operating speed of the key from the time interval for the phase inversion by the alternating signals from at least two reception electrodes of the plurality of reception electrodes for each key of the plurality of keys.

21. The detection device of claim 12,
the one or more reception electrodes comprising one reception electrode corresponding to each key of the plurality of keys;
the two or more transmission electrodes comprising two transmission electrodes;
the signal processing circuit configured to determine the operating speed of the key from the time interval when the phase of the alternating signal from the reception electrode of each key becomes identical to at least two specified phases.

22. The detection device of claim 21, wherein, when the key is operated between the at least two specified ranges, the two transmission electrodes are arranged to face the one reception electrode and are arranged so that a rate of each of the two transmission electrodes changes as an operating position of the key changes.

23. The detection device of claim 22, wherein at least one of the at least two specified phases is set by a user.

24. The detection device of claim 12,
wherein the two or more transmission electrodes are arranged on one of the key or a member connected to the key and a base of the key element; and
wherein the one or more reception electrodes are arranged on the other of the key or the member connected to the key and the base of the key element.

* * * * *